(12) United States Patent
Wong et al.

(10) Patent No.: US 12,237,232 B2
(45) Date of Patent: Feb. 25, 2025

(54) METHODS FOR FORMING SOURCE/DRAIN FEATURES

(71) Applicant: Taiwan Semiconductor Manufacturing Company, Ltd., Hsin-Chu (TW)

(72) Inventors: I-Hsieh Wong, Hsinchu (TW); Wei-Yang Lee, Taipei (TW); Chia-Pin Lin, Hsinchu County (TW); Yuan-Ching Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 400 days.

(21) Appl. No.: 17/667,115

(22) Filed: Feb. 8, 2022

(65) Prior Publication Data

US 2023/0253260 A1    Aug. 10, 2023

(51) Int. Cl.
| | |
|---|---|
| *H01L 21/8238* | (2006.01) |
| *H01L 21/02* | (2006.01) |
| *H01L 27/092* | (2006.01) |
| *H01L 29/06* | (2006.01) |
| *H01L 29/423* | (2006.01) |

(Continued)

(52) U.S. Cl.
CPC ........ *H01L 21/823814* (2013.01); *H01L 21/0259* (2013.01); *H01L 21/823807* (2013.01); *H01L 21/823878* (2013.01); *H01L 27/092* (2013.01); *H01L 29/0665* (2013.01); *H01L 29/42392* (2013.01); *H01L 29/66545* (2013.01); *H01L 29/66553* (2013.01); *H01L 29/66742* (2013.01);

(Continued)

(58) Field of Classification Search
None
See application file for complete search history.

(56) References Cited

U.S. PATENT DOCUMENTS

| | | | |
|---|---|---|---|
| 10,510,875 B2 | 12/2019 | Liao et al. | |
| 2012/0286337 A1* | 11/2012 | Liang | H01L 27/1211 |
| | | | 257/288 |

(Continued)

OTHER PUBLICATIONS

Wang, Shu Wen, "Forming Source and Drain Features in Semiconductor Devices", U.S. Appl. No. 17/341,745, filed Jun. 8, 2021, Assignee: Taiwan Semiconductor Manufacturing Co., Ltd., 34 pages of specification, 44 sheets of drawings.

*Primary Examiner* — Anthony Ho
(74) *Attorney, Agent, or Firm* — HAYNES AND BOONE, LLP

(57) ABSTRACT

A semiconductor structure and a method of forming the same are provided. In an embodiment, a method includes receiving a workpiece comprising a substrate, an active region protruding from the substrate, and a dummy gate structure disposed over a channel region of the active region. The method also includes forming a trench in a source/drain region of the active region, forming a sacrificial structure in the trench, conformally depositing a dielectric film over the workpiece, performing a first etching process to etch back the dielectric film to form fin sidewall (FSW) spacers extending along sidewalls of the sacrificial structure, performing a second etching process to remove the sacrificial structure to expose the trench, forming an epitaxial source/drain feature in the trench such that a portion of the epitaxial source/drain feature being sandwiched by the FSW spacers, and replacing the dummy gate structure with a gate stack.

20 Claims, 33 Drawing Sheets

(51) Int. Cl.
　　*H01L 29/66* 　　(2006.01)
　　*H01L 29/786* 　(2006.01)
(52) U.S. Cl.
　　CPC .. *H01L 29/78618* (2013.01); *H01L 29/78696* (2013.01)

(56) References Cited

U.S. PATENT DOCUMENTS

| | | | |
|---|---|---|---|
| 2018/0158930 A1 | 6/2018 | Liao | |
| 2020/0119161 A1 | 4/2020 | Liao et al. | |
| 2021/0098304 A1* | 4/2021 | Chang | H01L 29/66553 |
| 2021/0265349 A1 | 8/2021 | Chung | |
| 2021/0359091 A1* | 11/2021 | Hsu | H01L 21/823418 |
| 2022/0037340 A1* | 2/2022 | Yang | H01L 29/41766 |
| 2022/0320276 A1* | 10/2022 | Lin | H01L 29/4991 |
| 2022/0367728 A1* | 11/2022 | Lin | H01L 29/66439 |
| 2023/0063612 A1* | 3/2023 | Lin | H01L 29/41766 |
| 2023/0068664 A1* | 3/2023 | Lee | H01L 29/785 |

* cited by examiner

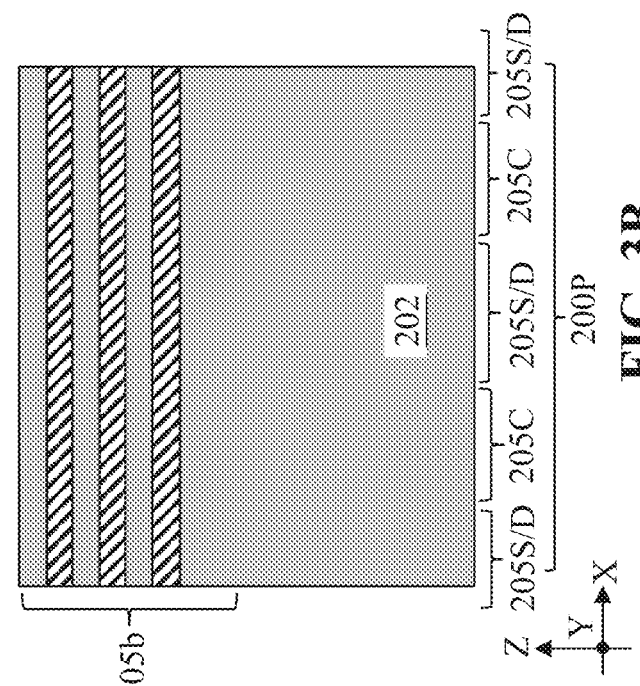
FIG. 3A
FIG. 3B

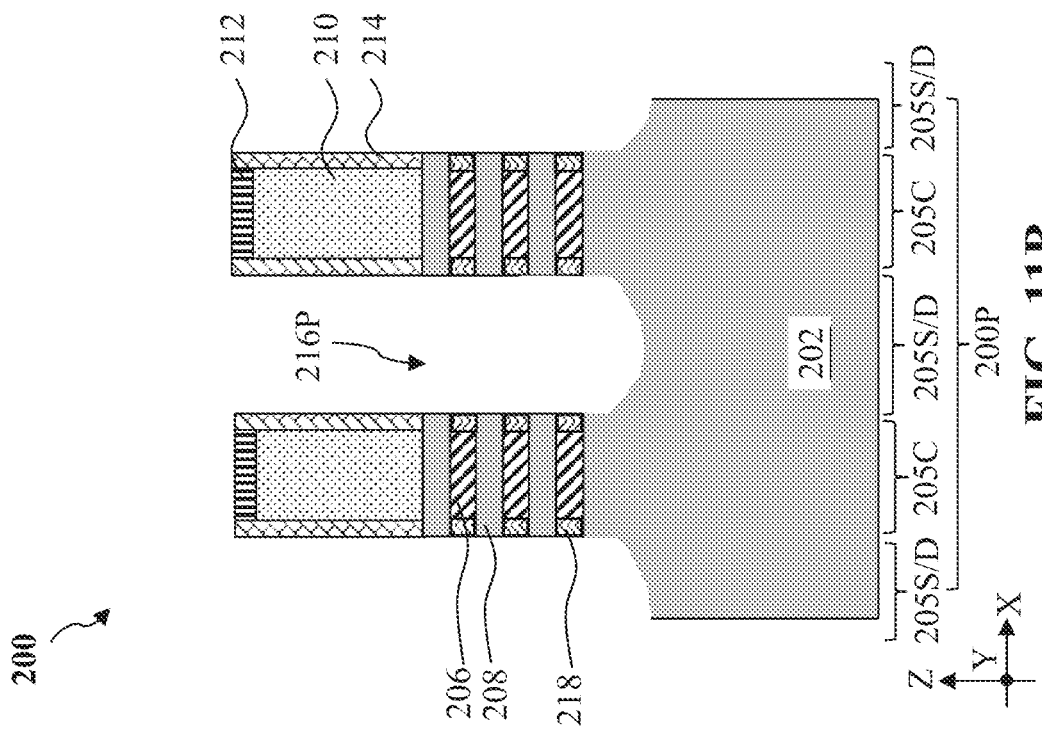
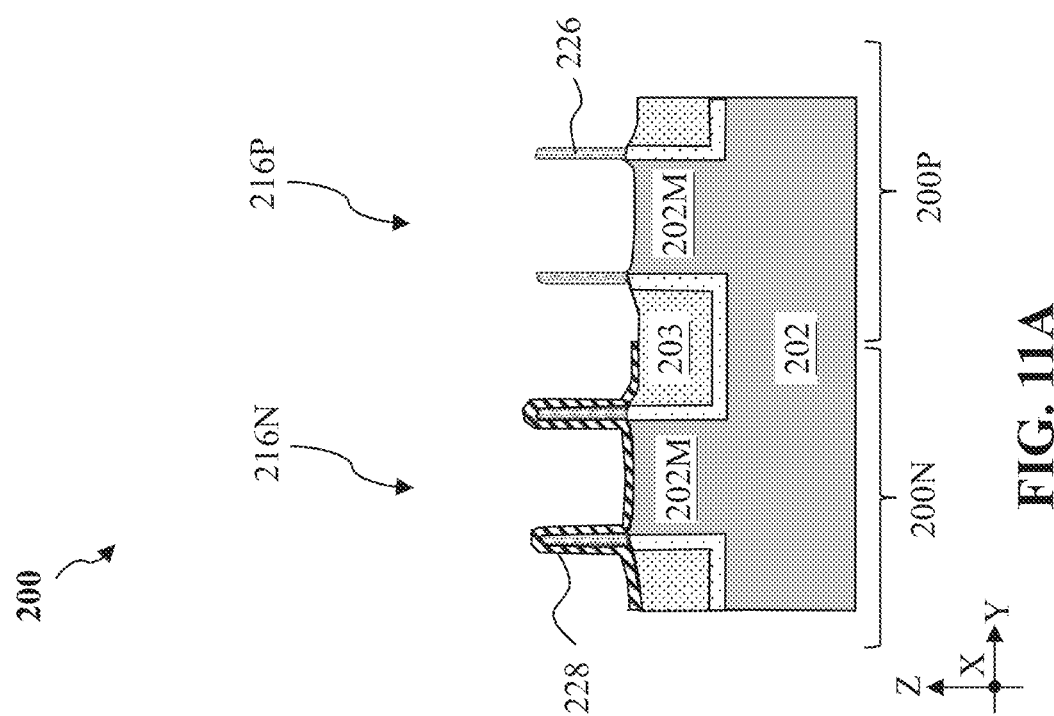
FIG. 11B
FIG. 11A

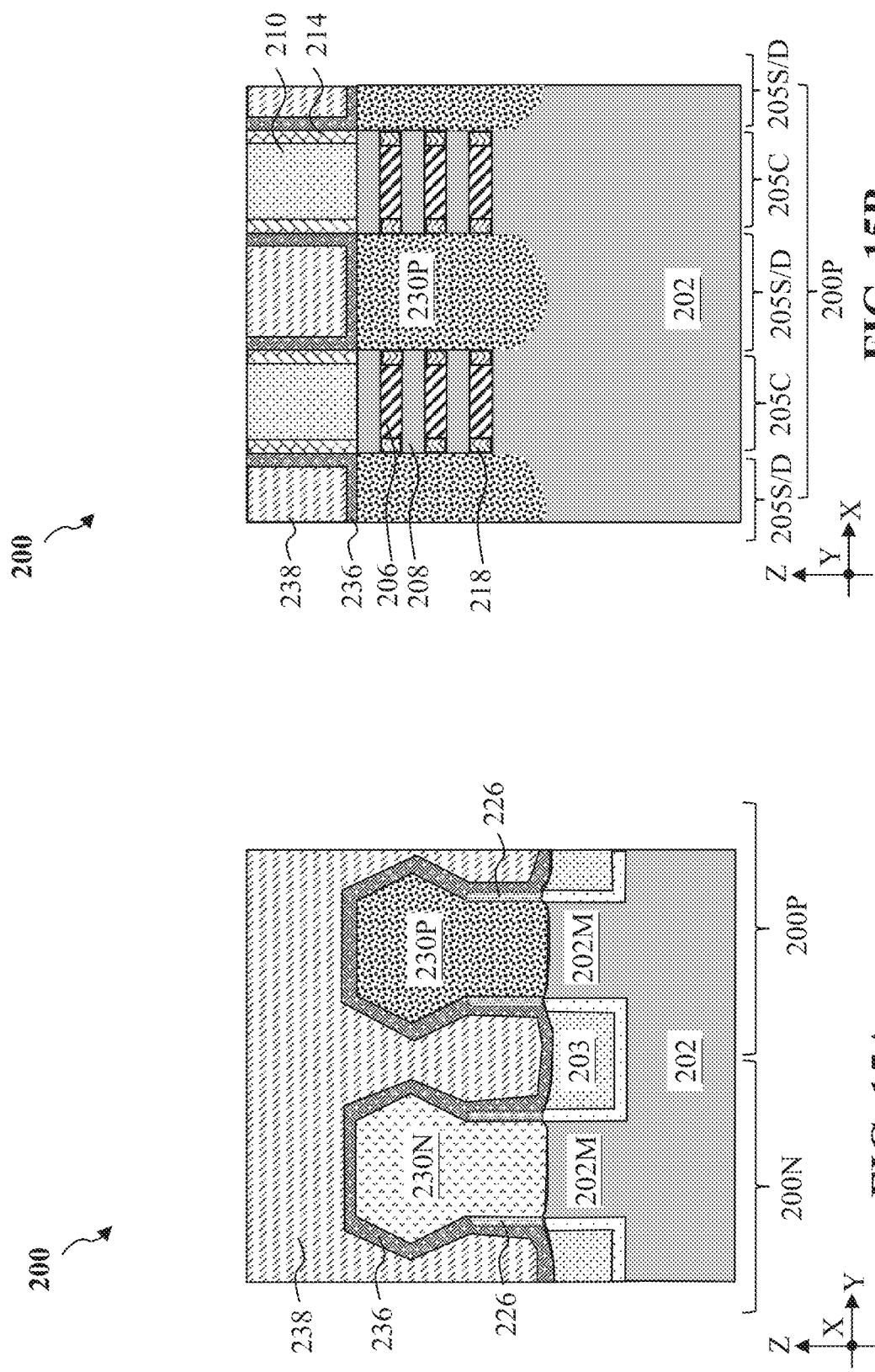

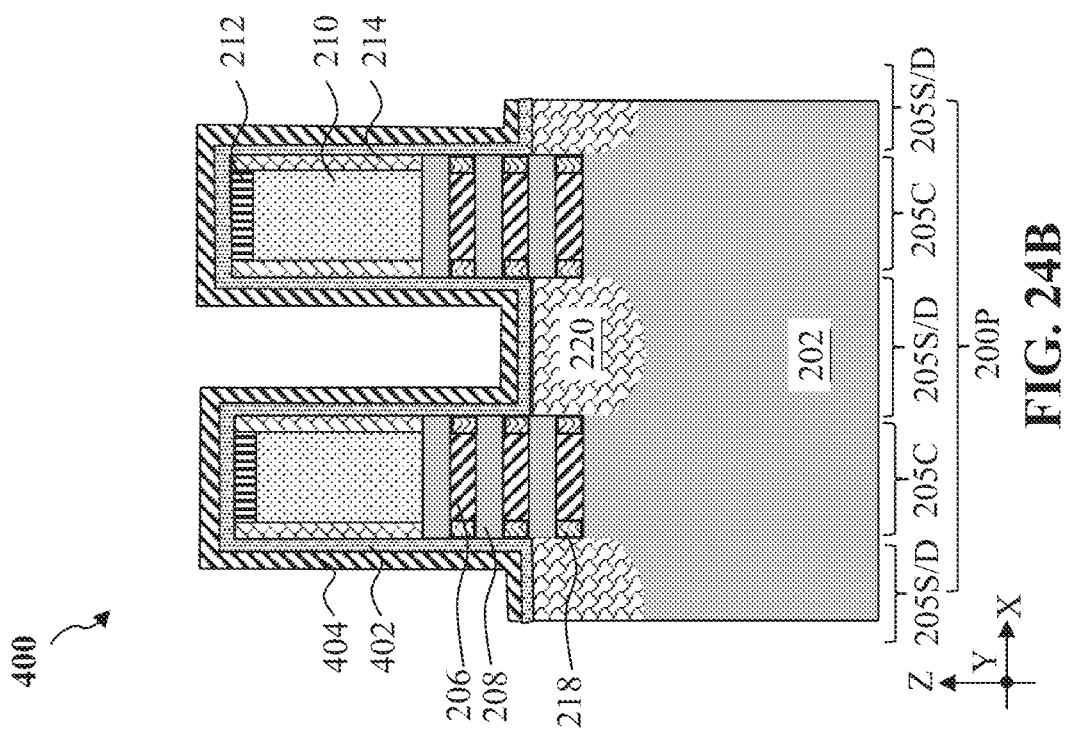
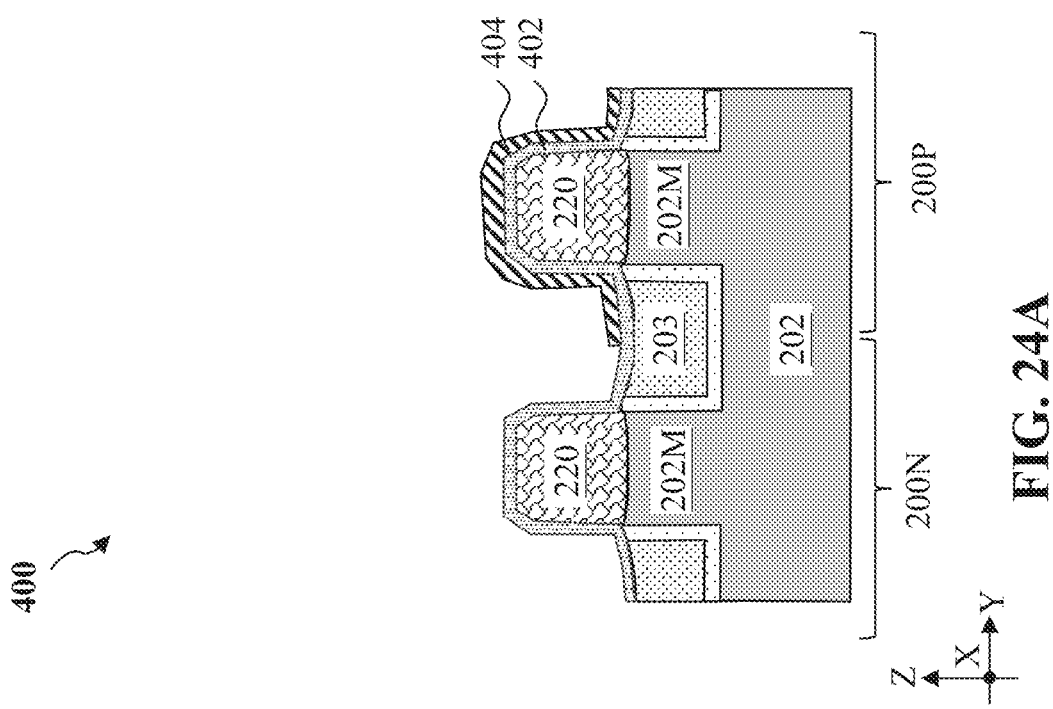
FIG. 24B
FIG. 24A

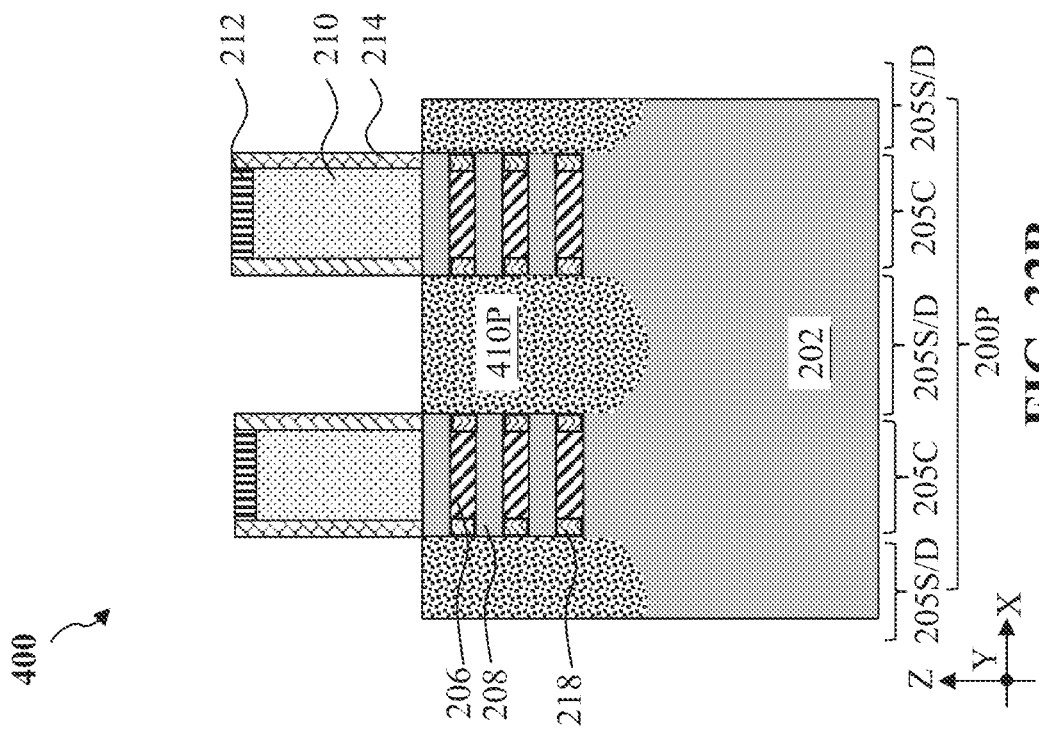
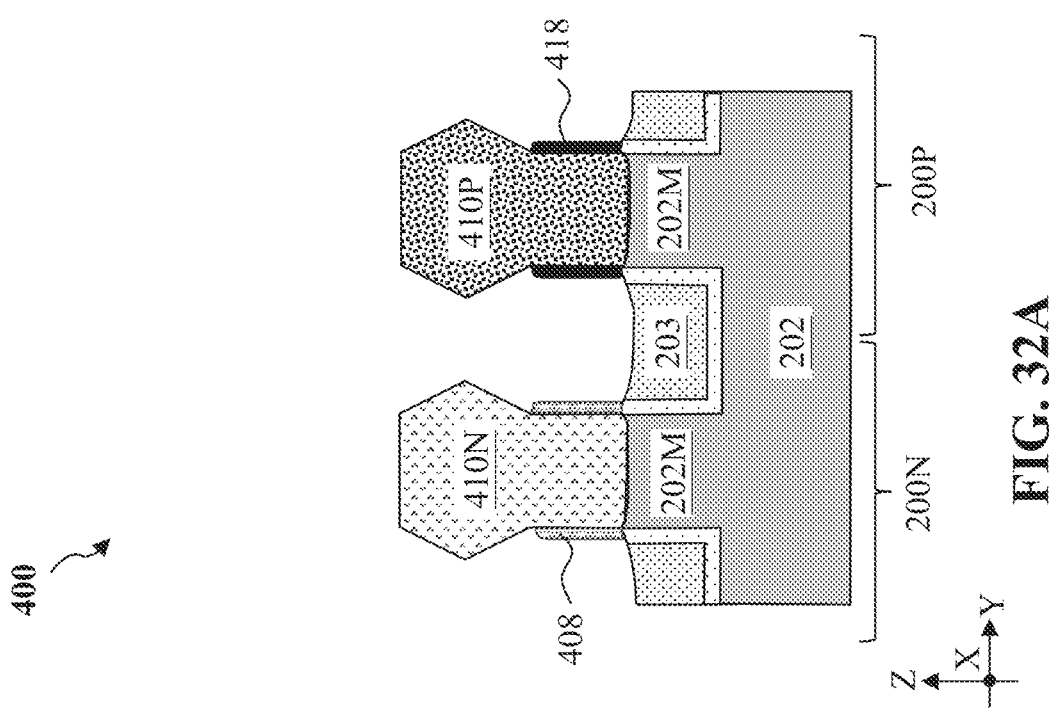
FIG. 32B
FIG. 32A

US 12,237,232 B2

METHODS FOR FORMING SOURCE/DRAIN FEATURES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

The aggressive scaling down also gives rise to various challenges. For example, aggressive scaling down of IC dimensions has resulted in densely spaced active regions, and source/drain features formed in and over the densely spaced active regions may merge, leading to undesired electrical issues. Dielectric fins have been implemented to isolate adjacent source/drain features. However, the dielectric fins may introduce extra issues such as increased parasitic capacitance between two adjacent source/drain features, leading to degraded device performance. While existing methods for preventing the merge of adjacent source/drain features are generally satisfactory for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIGS. 3A, 4A, 5A, 6A, 7A, 8A, 9A, 11A, 12A, 13A, 14A, 15A, 16A, and 18A illustrate fragmentary cross-sectional views of the workpiece taken along line A-A as shown in FIG. 2 during various fabrication stages in the method of FIG. 1, according to various aspects of the present disclosure.

FIGS. 3B, 4B, 5B, 6B. 7B, 8B, 9B. 11B, 12B, 13B, 14B, 15B, 16B, and 18B illustrate fragmentary cross-sectional views of the workpiece taken along line B-B as shown in FIG. 2 during various fabrication stages in the method of FIG. 1, according to various aspects of the present disclosure.

FIGS. 23A, 24A, 25A, 26A, 27A, 28A, 29A, 30A, 31A and 32A illustrate fragmentary cross-sectional views of the workpiece taken along line A-A as shown in FIG. 2 during various fabrication stages in the method of FIG. 22, according to various aspects of the present disclosure.

FIGS. 23B, 24B, 25B, 26B, 27B, 28B, 29B, 30B, 31B and 32B illustrate fragmentary cross-sectional views of the workpiece taken along line B-B as shown in FIG. 2 during various fabrication stages in the method of FIG. 22, according to various aspects of the present disclosure.

DETAILED DESCRIPTION

Figure 1:
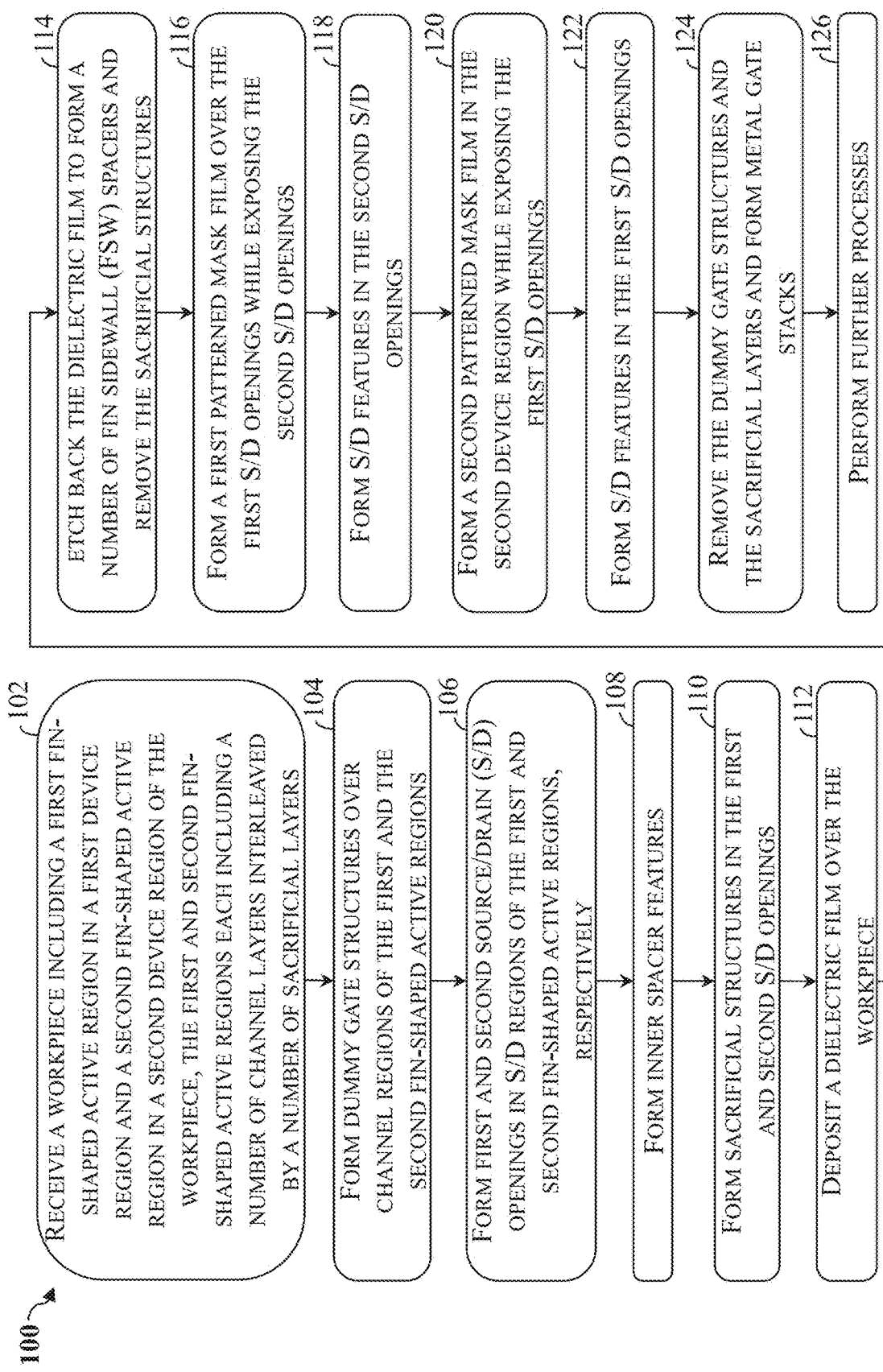
FIG. 1 is a flowchart illustrating an exemplary method of forming a semiconductor structure, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below." "lower." "above." "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Multi-gate devices are introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

In various implementations, source/drain features of the MBC transistor may be fabricated to have large volumes for several reasons such as providing enough contact areas for source/drain contacts, reducing parasitic resistance associated with the source/drain features, and/or adjusting the strain to the channel region. In some existing implementations, before recessing source/drain regions for forming source/drain openings (which would be filled by source/drain features), a cladding layer and a dielectric fin may be formed to fill the source/drain openings between two adjacent active regions. The dielectric fin is configured to present neighboring source/drain features from being merged during their epitaxial growths. As the scaling down continues, the distance between two adjacent active regions shrinks, which reduces the spacing for forming source/drain features and the spacing for forming the dielectric fin. Also, besides taking up an undue amount of real estate in an IC chip, the dielectric fin may introduce extra issues such as increased parasitic capacitance between two adjacent source/drain features, leading to degraded device performance.

The present disclosure is directed to methods of forming semiconductor structures with fin sidewall (FSW) spacers such that the epitaxial growth of lower portions of the source/drain features are confined, thereby preventing the merge of two adjacent source/drain features. In some embodiments, an exemplary method includes receiving a workpiece having a substrate, an active region protruding from the substrate, and a dummy gate structure disposed over a channel region of the active region. The method also includes forming a trench in a source/drain region, forming a sacrificial structure in the trench, conformally depositing a dielectric film over the workpiece, performing an etching process to etch back the dielectric film to form fin sidewall (FSW) spacers extending along sidewalls of the sacrificial structure and to remove the sacrificial structure to expose the trench, and forming an epitaxial source/drain feature in the trench. As such, at least a portion of the epitaxial source/drain feature is sandwiched by the FSW spacers, preventing adjacent source/drain features from being merged while also providing source/drain features with satisfactory volumes.

Figure 21B:
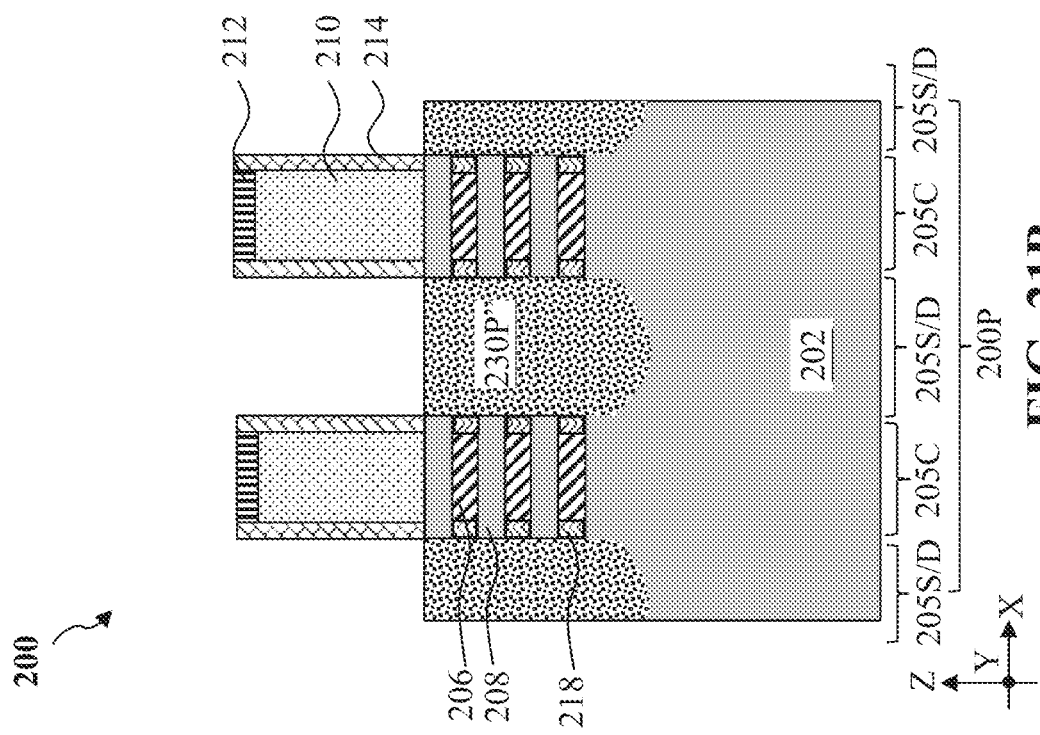
Figure 21A:
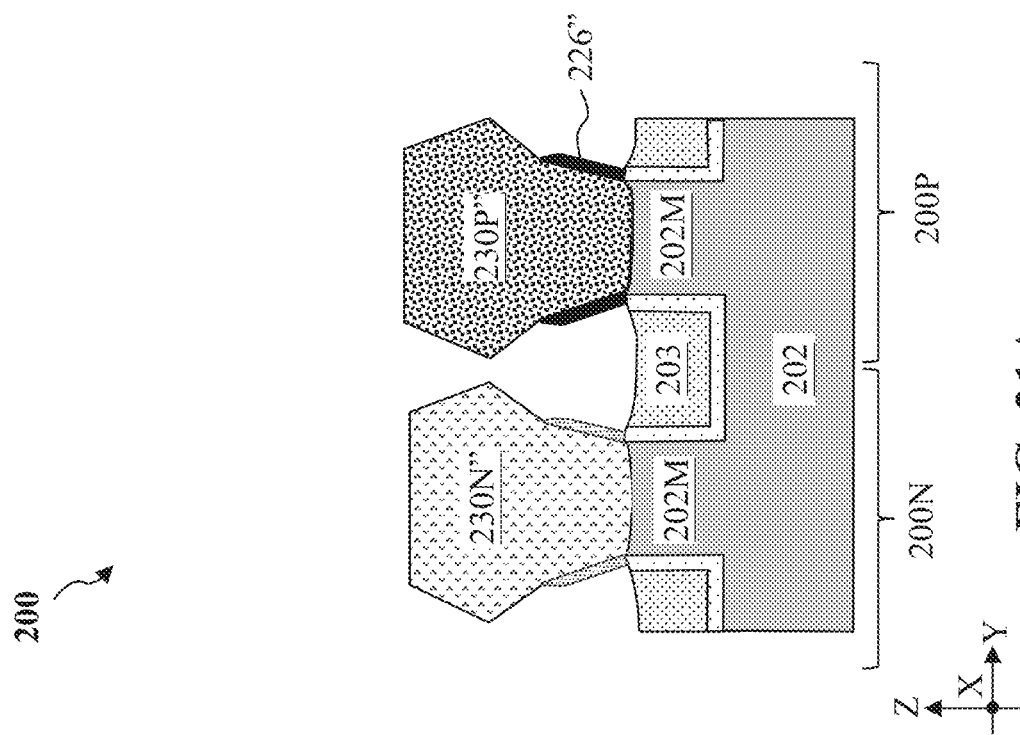
Figure 22:
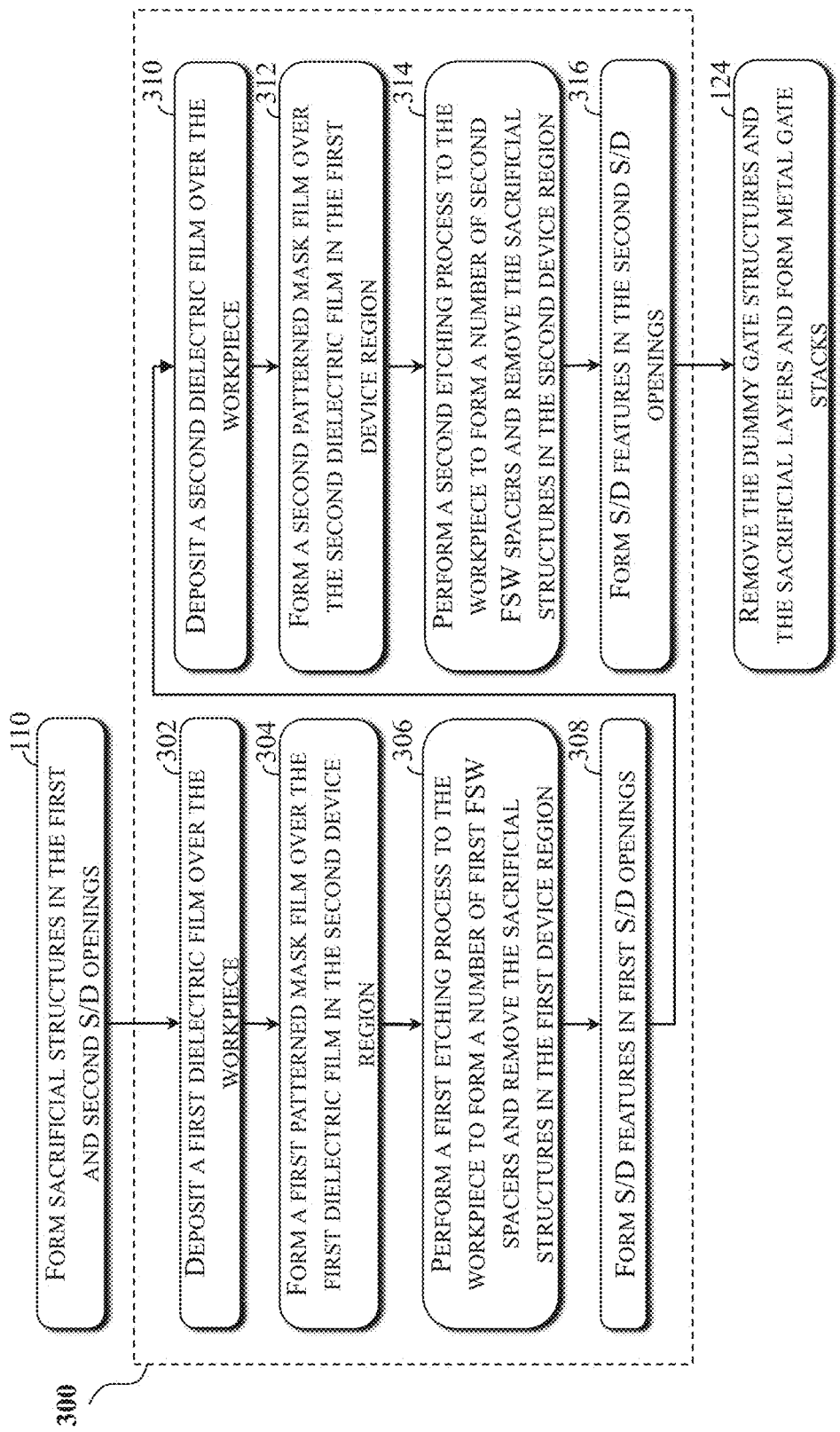
FIG. 22 is a flowchart illustrating an alternative method of forming a semiconductor structure, according to various aspects of the present disclosure.

The various aspects of the present disclosure will now be described in more detail with reference to the figures. In that regard, FIG. 1 is a flowchart illustrating a method 100 of forming a semiconductor structure 200 according to embodiments of the present disclosure, FIG. 22 is a flowchart illustrating an alternative method 300 of forming a semiconductor structure 400 according to embodiments of the present disclosure. Method 100 and method 300 are merely examples and are not intended to limit the present disclosure to what are explicitly illustrated therein. Additional steps can be provided before, during and after the method 100 and method 300, and some steps described can be replaced, eliminated, or moved around for additional embodiments of methods. Not all steps are described herein in detail for reasons of simplicity. Method 100 is described below in conjunction with FIGS. 2, 3A-9A, 3B-9B, 10, 11A-16A, 11B-16B, 17, 18A-21A and 18B-21B, which are fragmentary cross-sectional views and/or top views of a workpiece 200 at different stages of fabrication according to embodiments of the method 100 in FIG. 1. Method 300 is described below in conjunction with FIGS. 23A-33A and 23B-33B, which are fragmentary cross-sectional views and/or top views of a workpiece 400 at different stages of fabrication according to embodiments of the method 300 in FIG. 22. For avoidance of doubts, the X, Y and Z directions in FIGS. 2, 3A-9A, 3B-9B, 10, 11A-16A, 11B-16B, 17, 18A-21A, 18B-21B, 23A-33A and 23B-33B are perpendicular to one another and are used consistently. Because the workpiece 200/400 will be fabricated into a semiconductor structure, the workpiece 200/400 may be referred to herein as a semiconductor structure 200/400 as the context requires. Throughout the present disclosure, like reference numerals denote like features unless otherwise expressly excepted.

Figure 2:
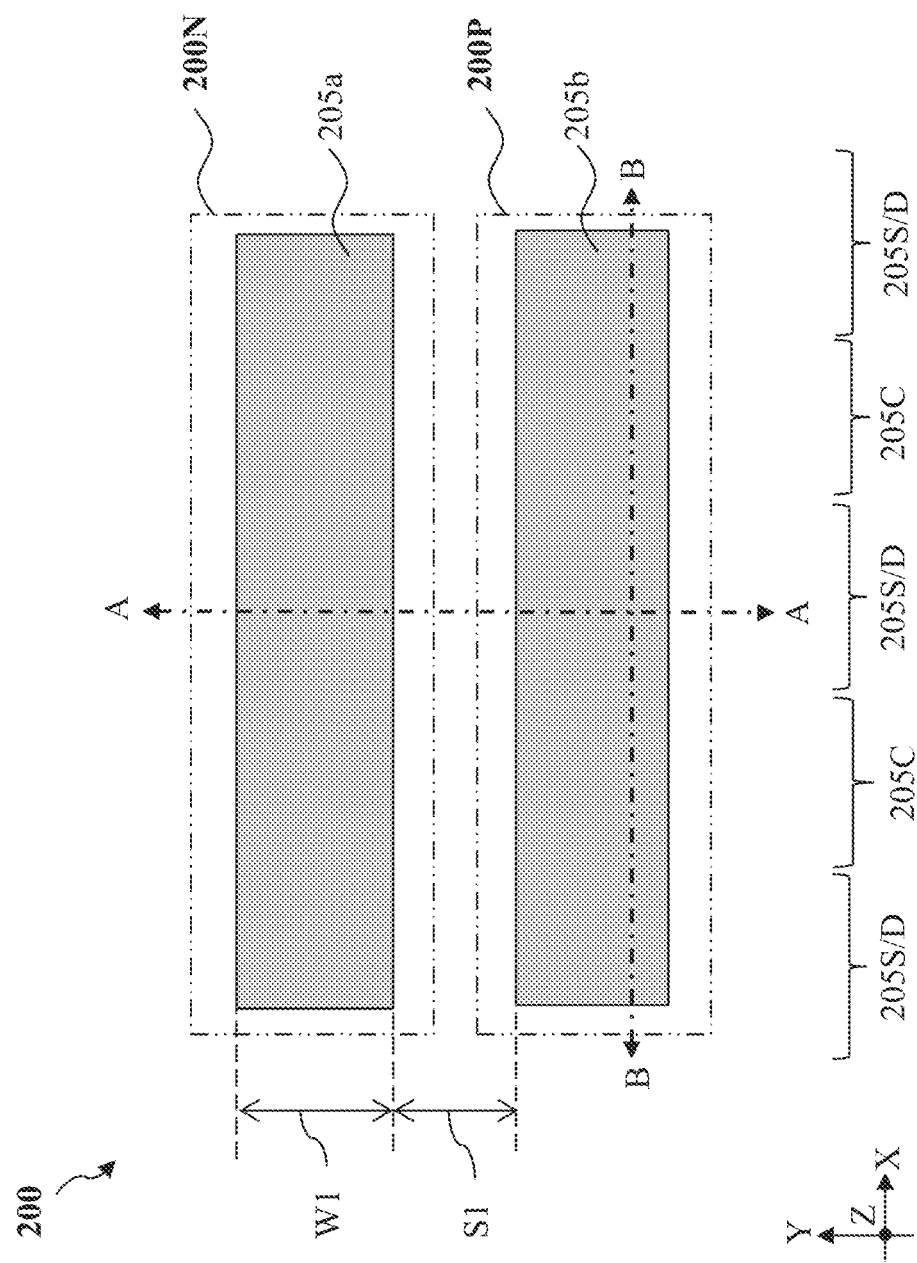
FIG. 2 illustrates a fragmentary top view of an exemplary workpiece to undergo various stages of operations in the method of FIG. 1, according to various aspects of the present disclosure.

Referring now to FIGS. 1, 2, 3A and 3B, method 100 includes a block 102 where a workpiece 200 is received. FIG. 2 depicts a top view of an exemplary workpiece 200, FIGS. 3A and 3B depict cross-sectional views of the workpiece 200 taken along line A-A and line B-B as shown in FIG. 2, respectively. As shown in FIG. 3A, the workpiece 200 includes a substrate 202. In an embodiment, the substrate 202 is a bulk silicon substrate (i.e., including bulk single-crystalline silicon). The substrate 202 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator (SGOI) substrate, or a germanium-on-insulator (GeOI) substrate, and includes a carrier, an insulator on the carrier, and a semiconductor layer on the insulator.

The substrate 202 may include various doped regions configured according to design requirements of the semiconductor structure 200. P-type doped regions may include p-type dopants, such as boron (B), boron difluoride ($BF_2$), other p-type dopant, or combinations thereof. N-type doped regions may include n-type dopants, such as phosphorus (P), arsenic (As), other n-type dopant, or combinations thereof. The various doped regions can be formed directly on and/or in substrate 202, for example, providing a p-type well, an n-type well, or combinations thereof. An ion implantation process, a diffusion process, and/or other suitable doping process can be performed to form the various doped regions. Referring to FIGS. 2 and 3A, the workpiece 200 includes a first device region 200N for formation of n-type MBC transistors and a second device region 202P 200P for formation of p-type MBC transistors. A portion of the substrate 202 in the first device region 200N may include a p-type well and a portion of the substrate 202 in the second device region 200P may include an n-type well.

Still referring to FIGS. 2, 3A and 3B, the workpiece 200 includes a number of fin-shaped active regions (such as active regions 205a and 205b) disposed over the substrate 202. Each fin-shaped active region extends lengthwise along the X direction and is divided into channel regions 205C and sources/drain regions 205S/D. In embodiments represented in FIG. 2, the workpiece 200 includes a first active region 205a in the first device region 200N and a second active region 205b in the second device region 200P. The first active region 205a and second active region 205b is spaced apart from each other by a spacing S1. Each of the first active region 205a and second active region 205b has a width W1 along the Y direction. In some embodiments, a width of the first active region 205a may be different from a width of the second active region 205b. It is understood that the number of active regions shown in FIG. 2 is for illustration purpose only, and the workpiece 200 may include any other suitable number of active regions.

The fin-shaped active regions (such as active regions 205a and 205b) may be formed from a portion of the substrate 202 and a vertical semiconductor stack 207 (shown in FIG. 3A), using a combination of lithography and etch steps. In the depicted embodiment, the stack 207 includes a number of channel layers 208 interleaved by a number of sacrificial layers 206. Each channel layer 208 may include a semiconductor material such as, silicon, germanium, silicon carbon, silicon germanium, or other suitable semiconductor materials, or combinations thereof, while each sacrificial layer 206 has a composition different from that of the channel layer 208. The channel layers 208 and the sacrificial layers 206 may be epitaxially deposited on the substrate 202 using molecular beam epitaxy (MBE), vapor-phase epitaxy (VPE), ultra-high vacuum CVD (UHV-CVD), and/or other suitable epitaxial growth processes. In this depicted example, the channel layer 208 is formed of silicon (Si), the sacrificial layer 206 is formed of silicon germanium (SiGe). The patterned portions of the substrate 202 that are formed directly under the patterned stacks 207 may be referred to as mesa structures 202M.

The fin-shaped active regions 205a and 205b are separated by an isolation structure 203. The isolation structure 203 may include silicon oxide, tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. The isolation structure 203 may include shallow trench isolation (STI) features. In some embodiments, the isolation structure 203 may be formed by filling trenches that separate the fin-shaped active regions with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing (CMP) process and selectively etched back to form the isolation structure 203. The isolation structure 203 may include a single-layer structure or a multi-layer structure that includes a liner 203a and a filler 203b as shown in FIG. 3A. The liner 203a may include silicon oxide or other suitable material and may be formed by conformally depositing a dielectric layer over the workpiece 200. The filler 203b may include silicon oxide, silicon oxynitride, fluorine-doped silicate glass (FSG), a low-k dielectric, combinations thereof, and/or other suitable materials and may be deposited by flowable CVD.

Figure 4B:
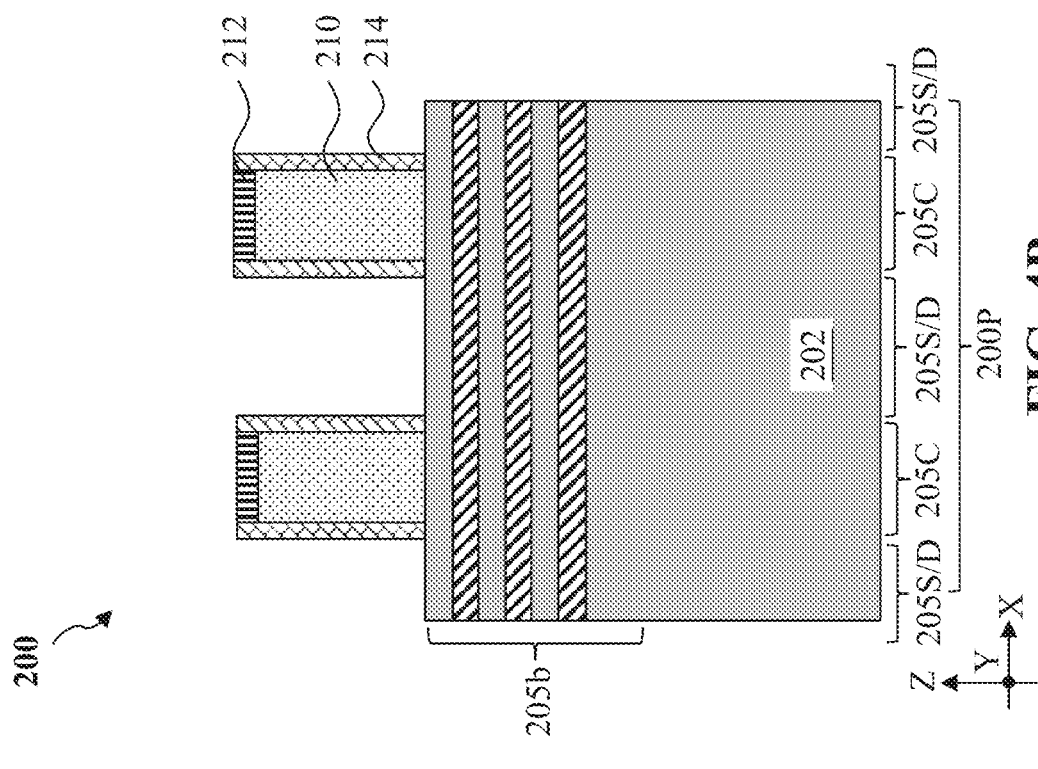
Figure 4A:
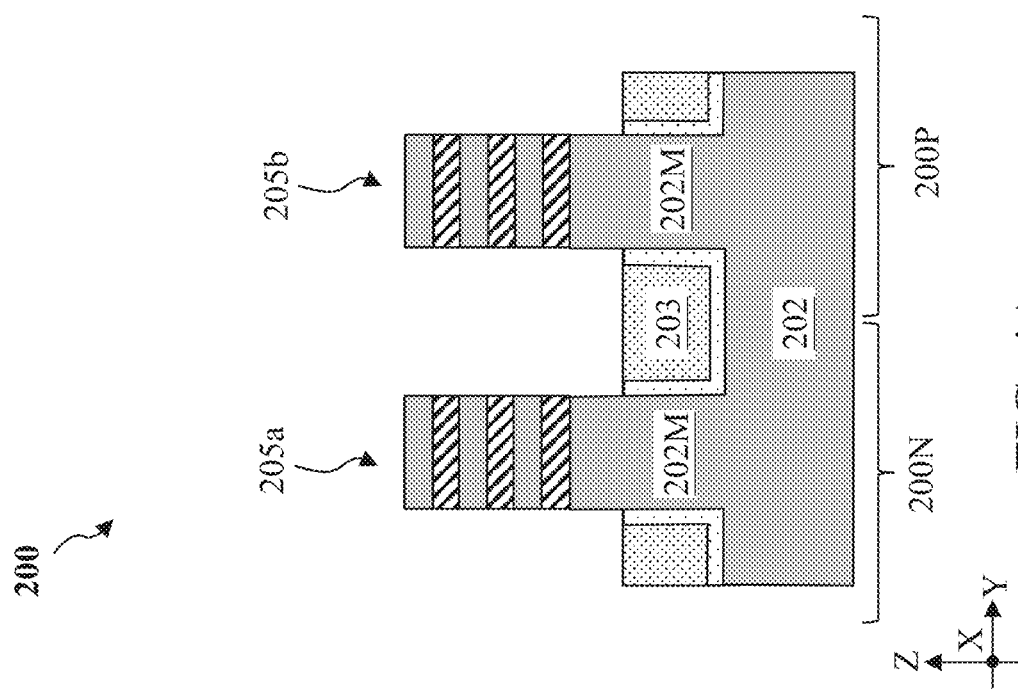

Referring to FIGS. 1, 4A, and 4B, method 100 includes a block 104 where dummy gate structures 210 are formed over channel regions 205C of the first and the second fin-shaped active regions 205a-205b. In this embodiment, a gate replacement process (or gate-last process) is adopted where the dummy gate structure 210 serves as a placeholder for functional gate stacks 240N/240P (shown in FIG. 16B and FIG. 17). Other processes and configurations are possible. While not explicitly shown, the dummy gate structure 210 may include a dummy dielectric layer and a dummy electrode disposed over the dummy dielectric layer. The regions of the fin-shaped active region 205a-205b underlying the dummy gate structures 210 may be referred to as channel regions 205C. Each of the channel regions 205C in a fin-shaped active region is sandwiched between two source/drain regions 205S/D along the X direction. A gate-top hard mask layer 212 is formed on the dummy gate structure 210. In some embodiments, the dummy gate dielectric layer may include silicon oxide. The dummy gate electrode layer may include polysilicon. The gate-top hard mask layer 212 may include silicon oxide, silicon nitride, other suitable materials, or a combination thereof. After the dummy gate structure 210 and gate-top hard mask layer 212 are formed, a gate spacer 214 may be formed along sidewalls of the dummy gate structure 210. The gate spacer 214 may include two or more gate spacer layers. Dielectric materials for the gate spacer 214 may be selected to allow selective removal of the dummy gate structure 210 without substantially damaging the gate spacer 214. Suitable dielectric materials may include silicon nitride, silicon oxycarbonitride, silicon carbonitride, silicon oxide, silicon oxycarbide, silicon carbide, silicon oxynitride, and/or combinations thereof.

Figure 5B:
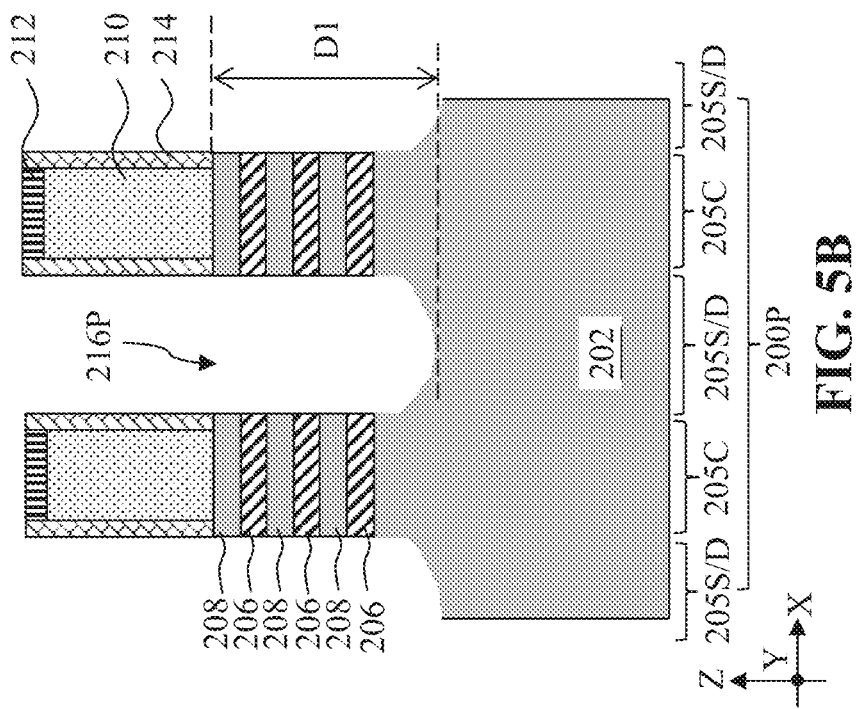
Figure 5A:
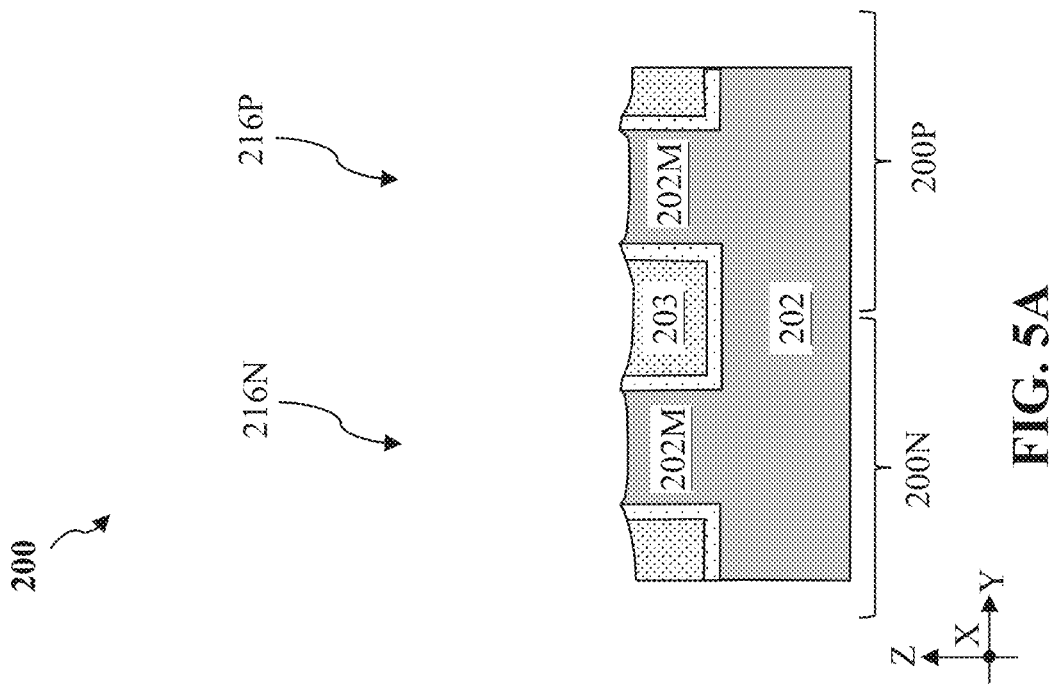

Referring now to FIGS. 1, 5A, and 5B, method 100 includes a block 106 where source/drain regions 205S/D of the first and second fin-shaped active regions 205a-205b are selectively recessed to form source/drain openings 216N and source/drain openings 216P over the first device region 200N and the second device region 200P, respectively. In some embodiments, the source/drain regions 205S/D of the fin-shaped active regions 205a-205b that are not covered by the dummy gate structures 210 or the gate spacer 214 are anisotropically etched by a dry etching process or other suitable etching process to form the source/drain openings 216N and 216P. The dry etching process may implement hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As illustrated in FIG. 5B, sidewalls of the channel layers 208 and the sacrificial layers 206 are exposed in the source/drain openings. In some embodiments, source/drain openings 216N and 216P may not only extend through the stack 207, but also extend through a portion of the substrate 202. A depth of the source/drain openings 216N and 216P may be referred to as D1. In embodiments represented in FIGS. 4B and 5B, the gate spacers 214 and the source/drain openings 216N and 216P are formed by two separate processes. In some other embodiments, after depositing a dielectric material for formation of the gate spacer 214, the source/drain regions 205S/D and portions of the dielectric material that are formed on the gate-top hard mask layer 212 and on the source/drain regions may be removed by a common etching process.

Figure 6B:
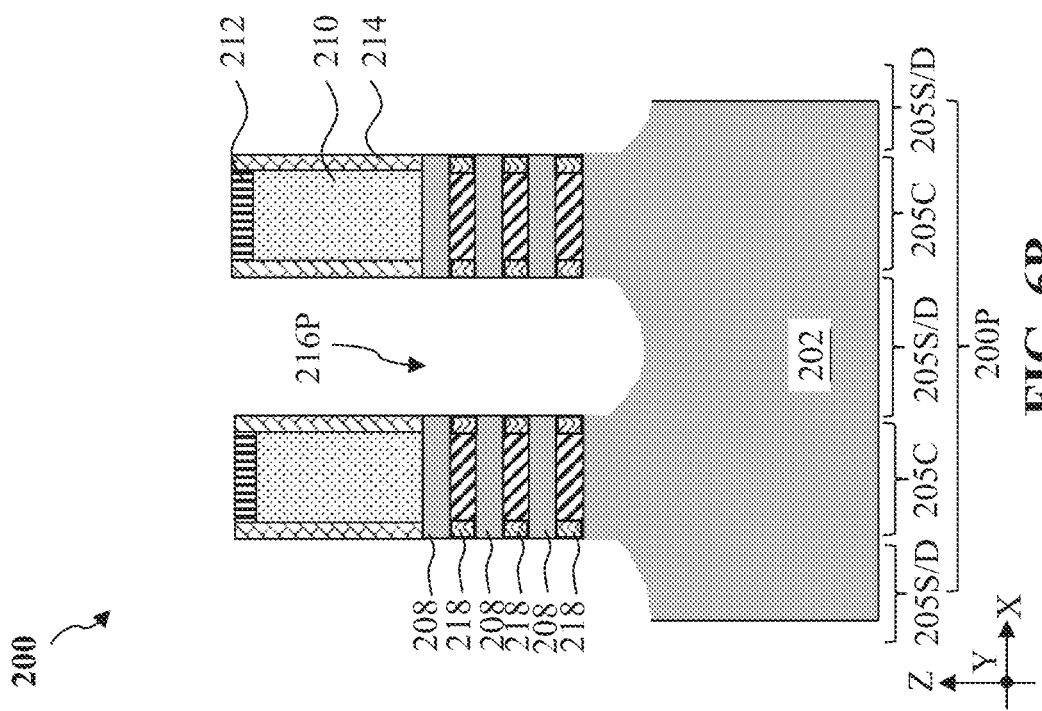
Figure 6A:
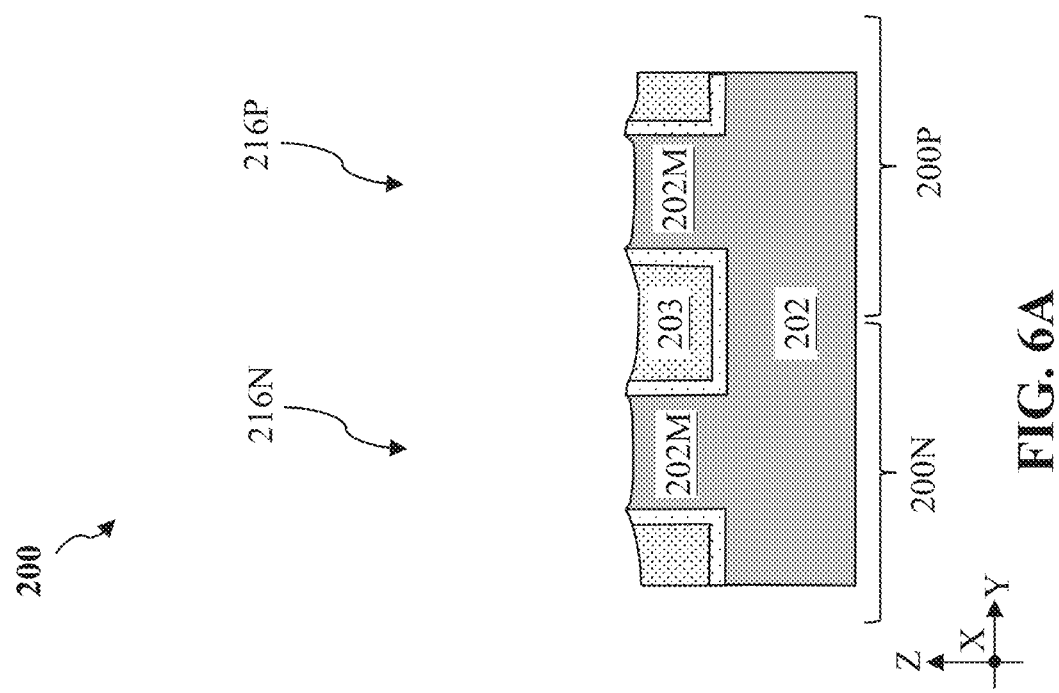

Referring now to FIGS. 1 and 6A and 6B, method 100 includes a block 108 where inner spacer features 218 are formed. More specifically, after forming the source/drain openings 216N and 216P, the sacrificial layers 206 exposed in the source/drain openings 216N and 216P are selectively and partially recessed to form inner spacer recesses (filled by inner spacer features 218), while the exposed channel layers 208 are substantially unetched. In some embodiments, this selective recess may include a selective isotropic etching process (e.g., a selective dry etching process or a selective wet etching process), and the extent at which the sacrificial layers 206 is recessed is controlled by duration of the etching process. After the formation of the inner spacer recesses, an inner spacer material layer is then conformally deposited using CVD or ALD over the workpiece 200, including over and into the inner spacer recesses. The inner spacer material may include silicon nitride, silicon oxycarbonitride, silicon carbonitride, silicon oxide, silicon oxycarbide, silicon carbide, or silicon oxynitride. After the deposition of the inner spacer material layer, the inner spacer material layer is etched back to form inner spacer features 218, as illustrated in FIG. 6B.

Figure 7A:
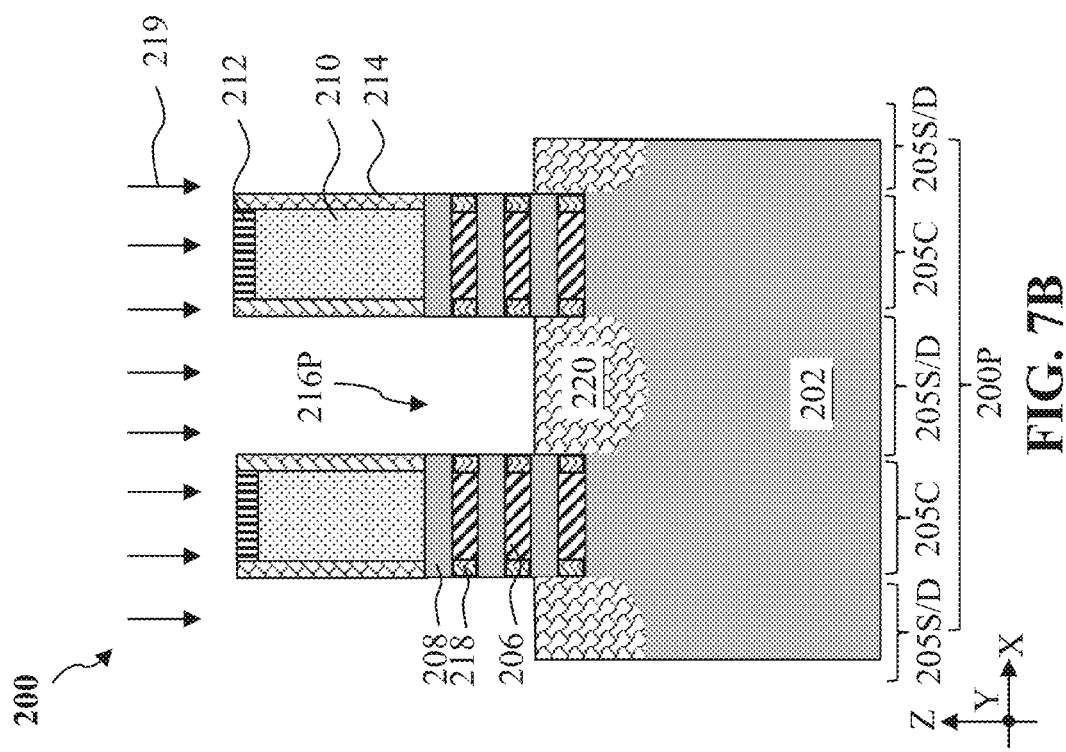
Figure 7B:
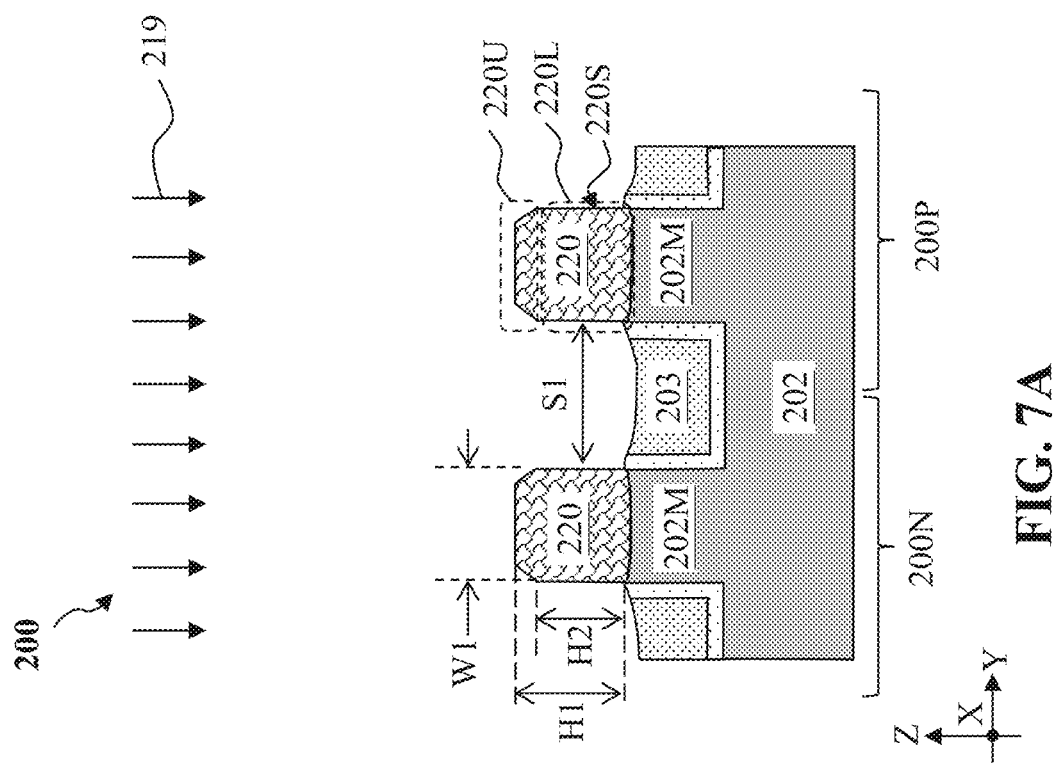

Referring now to FIGS. 1, 7A and 7B, method 100 includes a block 110 where a bottom-up growth process 219 is performed to form sacrificial structures 220 in the source/drain openings 216N and 216P. The bottom-up growth process 219 may include performing an epitaxial deposition/partial etch process and repeating the epitaxial deposition/partial etch process. Such repeated deposition/partial etch process may be called a cyclic deposition/etch (CDE) process. In embodiments where the sacrificial structure 220 includes semiconductor materials, the sacrificial structure 220 is undoped or not intentionally doped and may be epitaxially and selectively formed from top surfaces of the substrate 202 exposed by the source/drain openings 216N and 216P. That is, the sacrificial structure 220 may do not include dopants such as boron, phosphorus, gallium, or aluminum to facilitate the formation of the satisfactory sacrificial structures 220 (e.g., sacrificial structures 220 having substantially vertical sidewalls or intentionally formed tilted sidewalls). For example, the sacrificial structure 220 may include semiconductor materials such as undoped silicon (Si), undoped germanium (Ge), undoped tin (Sn) or undoped carbon (C). In embodiments where the sacrificial structure 220 includes undoped silicon, the formation of the sacrificial structure 220 may include using silicon-containing precursors such as silane ($SiH_4$), disilane ($Si_2H_6$), and/or other suitable species. By adjusting the etching recipe in the CDE process and/or the corresponding concentrations of different species of the precursors used in the bottom-up growth process 219, the sacrificial structure 220 may be formed to have substantially vertical sidewalls 220S.

Since the sacrificial structure 220 are formed in the source/drain openings 216N and 216P, the sacrificial structure 220 may also be referred to as dummy source/drain features 220. The sacrificial structure 220 includes a height H1 and is spaced apart from an adjacent sacrificial structure 220 by the spacing S1. Each of the sacrificial structures 220 has a lower portion 220L that has substantially vertical sidewalls 220S and a substantially uniform width W1 along the Y direction. The lower portion 220L has a height H2 along the Z direction. In some embodiments, the height H2 may be between about 2 nm and about 60 nm. The sacrificial structure 220 are configured to facilitate the formation of spacers at sidewalls 220S of the sacrificial structure 220. The spacers that would be formed at the sidewalls 220S of the sacrificial structure 220 may be referred to as fin sidewall (FSW) spacers. The height H2 of the lower portion 220L of the sacrificial structure 220 may affect the height of the FSW spacers. By adjusting the height H2, FSW spacers may be formed with a desired height, thereby forming a satisfactory source/drain feature with a satisfactory volume. The sacrificial structure 220 also has an upper portion 220U that has a nonuniform width along the Y direction. In this present embodiment, the width of the upper portion 220U is smaller than the width of the lower portion 220L along the Y direction. The sacrificial structures 220 may fully or partially fill the source/drain openings 216N and 216P, depending on the desired height of the FSW spacers. In embodiments represented in FIGS. 7A and 7B, the sacrificial structures 220 partially fill the source/drain openings 216N and 216P.

Figure 8B:
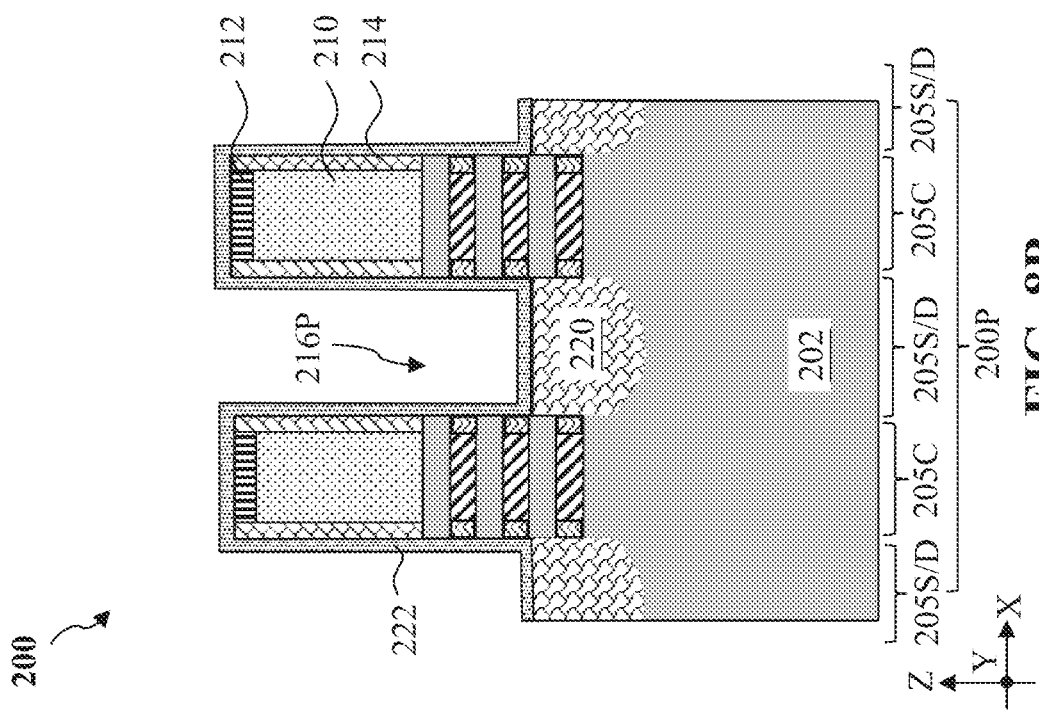
Figure 8A:
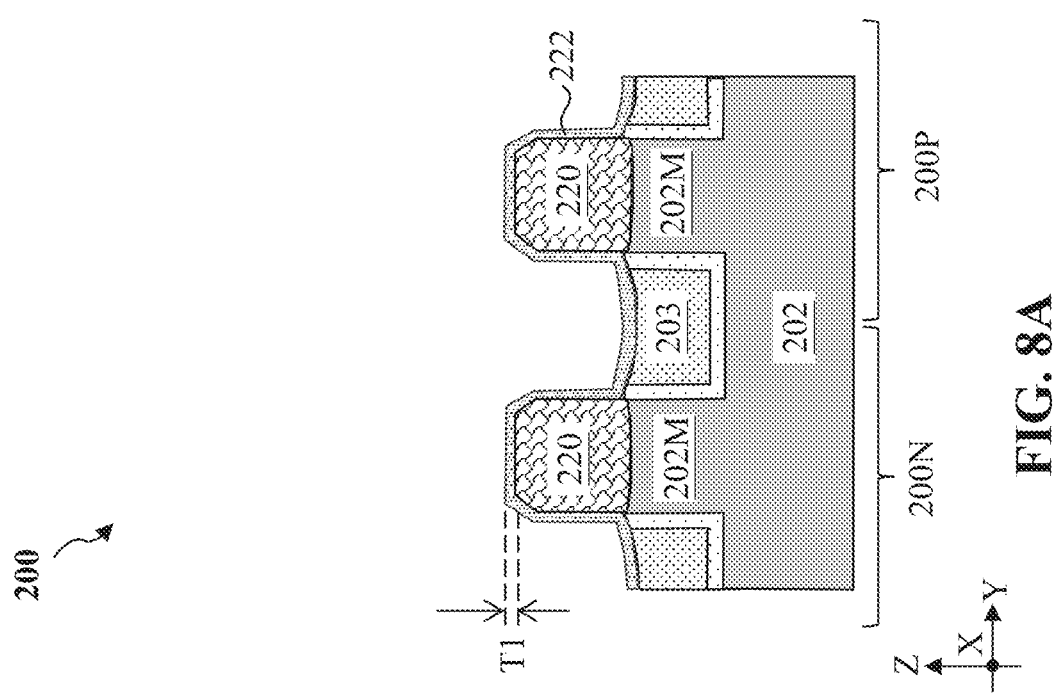

Referring now to FIGS. 1, 8A, and 8B, method 100 includes a block 112 where a dielectric film 222 is deposited conformally over the workpiece 200. For example, the dielectric film 222 is deposited conformally over the workpiece 200, including over top surfaces and sidewalls of the dummy gate structures 210, top surfaces and sidewalls of the dummy source/drain features 220, and top surfaces of the isolation structures 203. The dielectric film 222 may be formed using processes such as, CVD, atomic layer deposition (ALD), PVD, or other suitable process. The term "conformally" may be used herein for case of description of a layer having a substantially uniform thickness over various regions. The thickness T1 is smaller than half of the spacing S1 such that the dielectric film 222 would not merge during the deposition process. That is, T1<0.5*S1. In an embodiment, the thickness T1 of the dielectric film 222 may be between about 0.3 nm and about 8 nm such that the to-be-formed FSW spacers may be thick enough to withstand the following etching processes and thin enough to reduce the parasitic capacitance of the workpiece 200. In some embodiments, the dielectric film 222 may include a dielectric material that has, for example, aluminum (Al), titanium (Ti), lithium (Li), hafnium (Hf), zirconium (Zr), lanthanum (La), molybdenum (Mo), cobalt (Co), silicon (Si), oxygen (O), nitrogen (N), carbon (C), any other suitable elements, or combinations thereof. For example, the dielectric film 222 may include aluminum oxide ($Al_2O_3$), hafnium oxide ($HfO_2$), silicon oxycarbide (SiOC), silicon oxynitride (SiON), any other suitable elements, or combinations thereof. In some implementations, a composition of the dielectric film 222 is different from a composition of the gate spacer 214 and a composition of the inner spacer features 218 such that the portion of the dielectric film 222 that extends along sidewalls of the gate spacer 214 and the inner spacer features 218 may be selectively removed without substantially etching the gate spacer 214 or the inner spacer features 218. In some embodiments, the dielectric film 222 may be a single-layer structure or a multi-layer structure that is formed by depositing multiple dielectric layers.

Figure 9B:
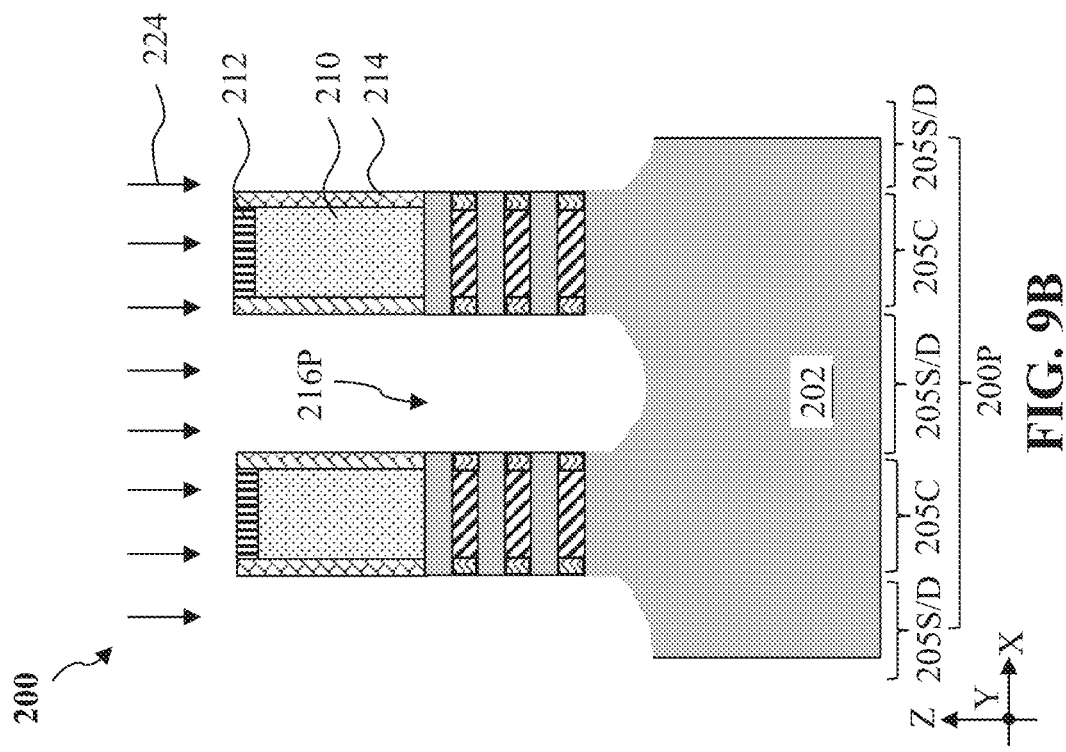
Figure 9A:
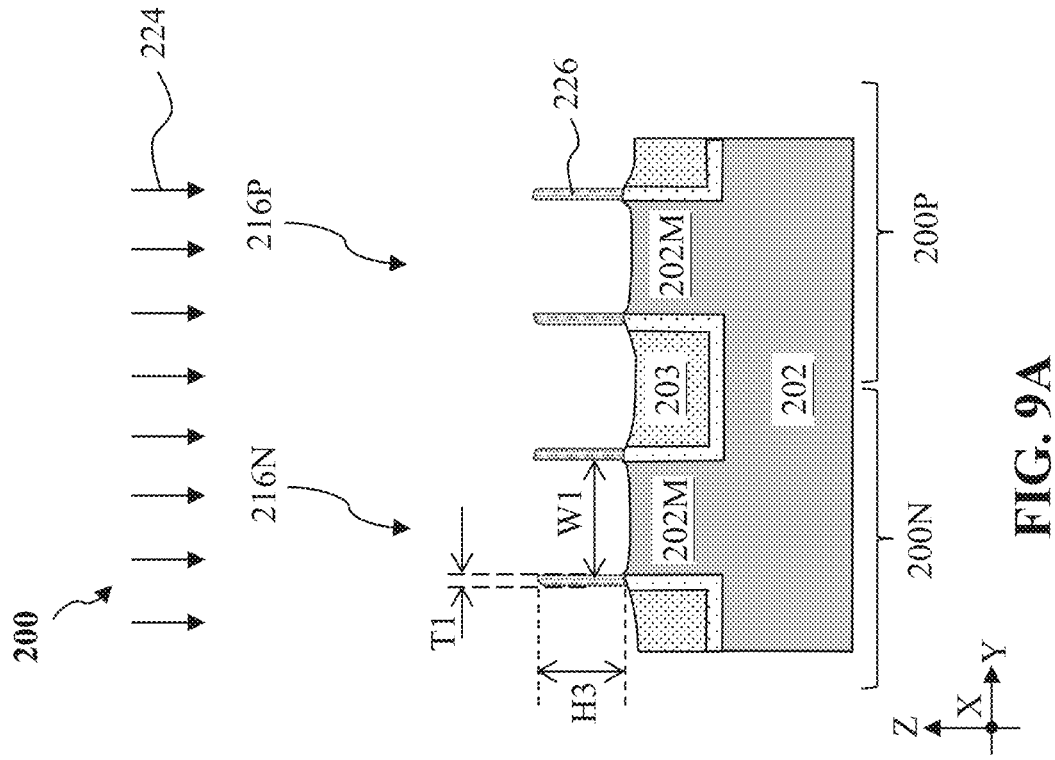

Referring now to FIGS. 1, 9A and 9B, method 100 includes a block 114 where an etching process 224 is performed to remove excess portions of the dielectric film 222 to form fin sidewall spacers 226. For example, as shown in FIG. 9A and FIG. 9B, the etching process 224 removes portions the dielectric film 222 that are formed on top surfaces of the sacrificial structures 220, top surfaces of the isolation structures 203, and top surfaces of the gate-top hard mask layers 212. The etching process 224 may include one or more dry etching processes and/or one or more wet etching processes. The dry etching process may implement hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, an oxygen-containing gas, a nitrogen containing gas, a hydrogen-containing gas, other suitable gases and/or plasmas, and/or combinations thereof. One or more parameters (such as pressure, RF power, temperature, flow rate, or multi-loop deposition-etching) of the etching process 224 may be adjusted such that the etching process 224 may remove portions of the dielectric film 222 that extend along sidewall surfaces of the gate spacers 214, sidewall surfaces of the channel layers 208, and sidewall surfaces of the inner spacer features 218 while not substantially etching portions (i.e., the FSW spacers 226) of the dielectric film 222 that extends along the sidewall 220S of the sacrificial structures 220. Put differently, the etching process 224 removes all other portions of the dielectric film 222 except the portion that extends along the sidewalls 220S of the sacrificial structures 220 to form the FSW spacers 226. In embodiments represented in FIG. 9A, the FSW spacers 226 are formed directly on the liner 203a of the isolation structure 203. In some other implementations, depends on the deposition thickness T1 of the dielectric film 222, the FSW spacers 226 may be further formed on a portion of the filler 203b of the isolation structure 203.

In some embodiments, the sacrificial structures 220 are substantially removed by the etching process 224. In embodiments where the formation of the FSW spacers 226 and the removal of the sacrificial structures 220 are obtained by a common etching process, due to the duration of the etching process 224, a height H3 of the FSW spacers 226 may be smaller than the height H2 of the lower portion 220L of the sacrificial structures 220. That is, H3<H2. In some other embodiments, the etching process 224 may be performed to form the FSW spacers 226 without substantially etching the sacrificial structures 220, and another etching process may be followed to remove the sacrificial structures 220 without substantially etching the FSW spacers 226. In embodiments where the formation of the FSW spacers 226 and the removal of the sacrificial structures 220 are obtained by separate etching processes, the FSW spacers 226 may have a height H3 that is substantially equal to the height H2 of the lower portion 220L of the sacrificial structure 220. That is, H3 may be between about 2 nm and about 60 nm. In some other implementations, the sacrificial structures 220 may be partially removed by the etching process 224, and a rest of the sacrificial structures 220 that is not removed by the etching process 224 may function as a part of the source/drain features (e.g., the source/drain features 230N and/or 230P) in a final structure of the workpiece 200. In embodiments where the sacrificial structures 220 are partially removed, a top surface of the rest of the sacrificial structures 220 may be lower than a top surface of the topmost channel layer of the channel layers 208.

Figure 10:
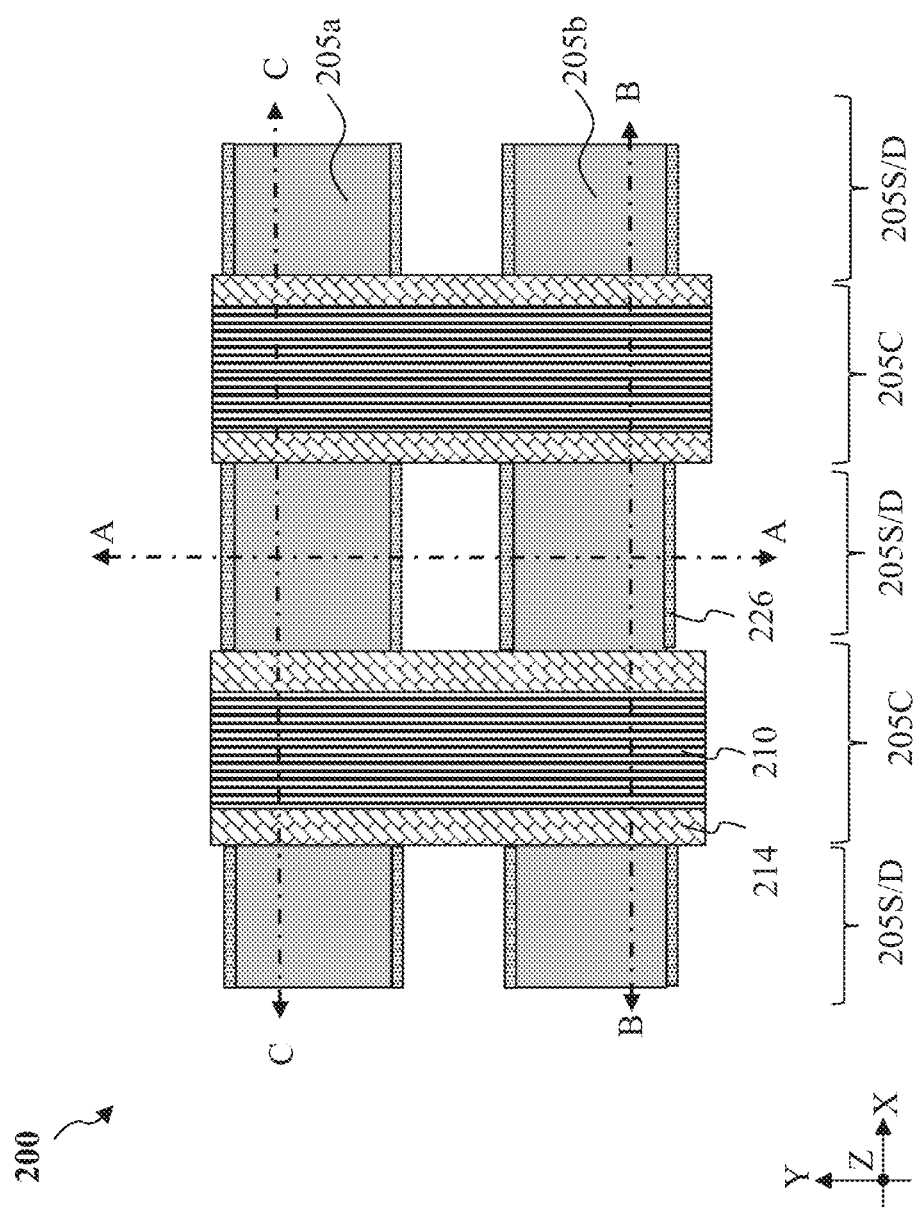
FIG. 10 illustrates a fragmentary top view of the workpiece shown in FIGS. 9A and 9B, according to various aspects of the present disclosure.

FIG. 10 depicts a top view of the workpiece 200 shown in FIGS. 9A and 9B. It is noted that, the FSW spacers 226 are visible when viewed from the X direction and are not visible when viewed from the Y direction. As such, at least portions of the source/drain openings 216N and 216P are confined by the channel regions 205C along the X direction, and lower portions of the source/drain (S/D) openings 216N and 216P are confined by the FSW spacers 226 along the Y direction. Therefore, lower portions of the to-be-formed source/drain features that fill the source/drain openings 216N and 216P will be confined along the Y direction and do not grow laterally.

Referring now to FIGS. 1, 11A and 11B, method 100 includes a block 116 where a first patterned mask film 228 is formed over the S/D openings 216N and the FSW spacers 226 in the first device region 200N while exposing features (e.g., source/drain openings 216P and FSW spacers 226) in the second device region 200P. In some embodiments, a mask film may be deposited over the workpiece 200 using CVD or ALD and then a photoresist layer (not shown) is deposited over the mask film using spin-on coating or a suitable process. The photoresist layer may be patterned using photolithography process to form a patterned photoresist layer that can be applied as an etch mask in an etching process to pattern the mask film to form the first patterned mask film 228. As shown in FIG. 11A, the first patterned mask film 228 covers/protects the source/drain opening 216N while the source/drain opening 216P is exposed. After forming the first patterned mask film 228, the patterned photoresist layer may be removed. In some embodiments, the first patterned mask film 228 may include silicon oxide, silicon nitride, silicon oxynitride, silicon oxycarbonitride, silicon carbide, or silicon oxycarbide. A composition of the first patterned mask film 228 may be different than that of the FSW spacers 226 such that the first patterned mask film 228 may be selectively removed in subsequent processes.

Figure 12B:
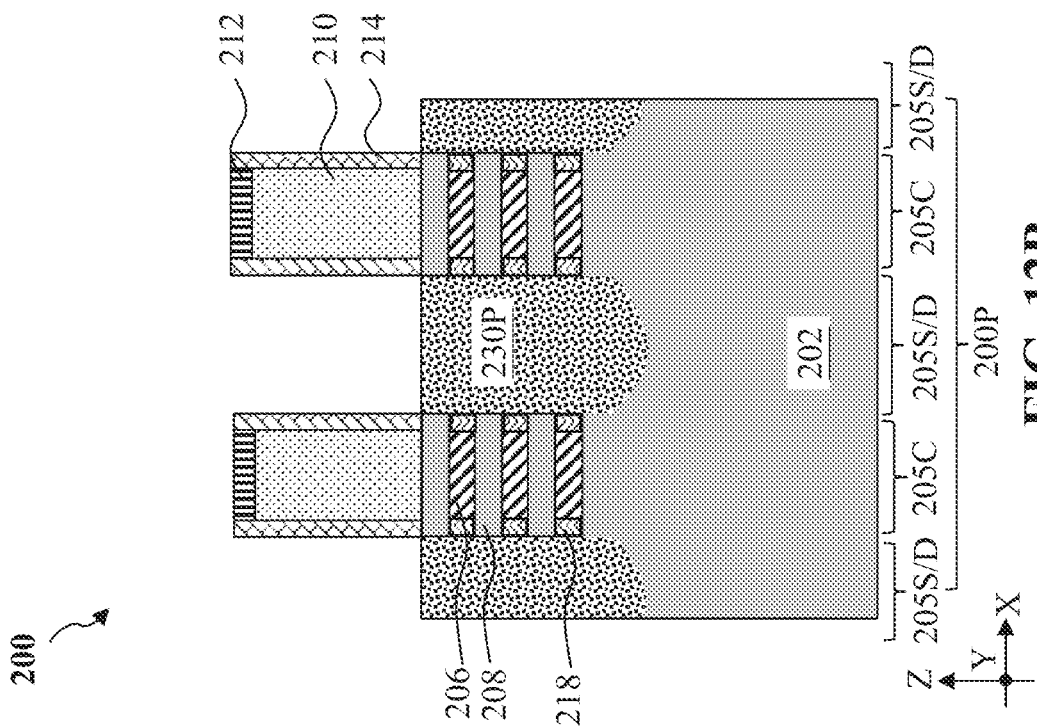
Figure 12A:
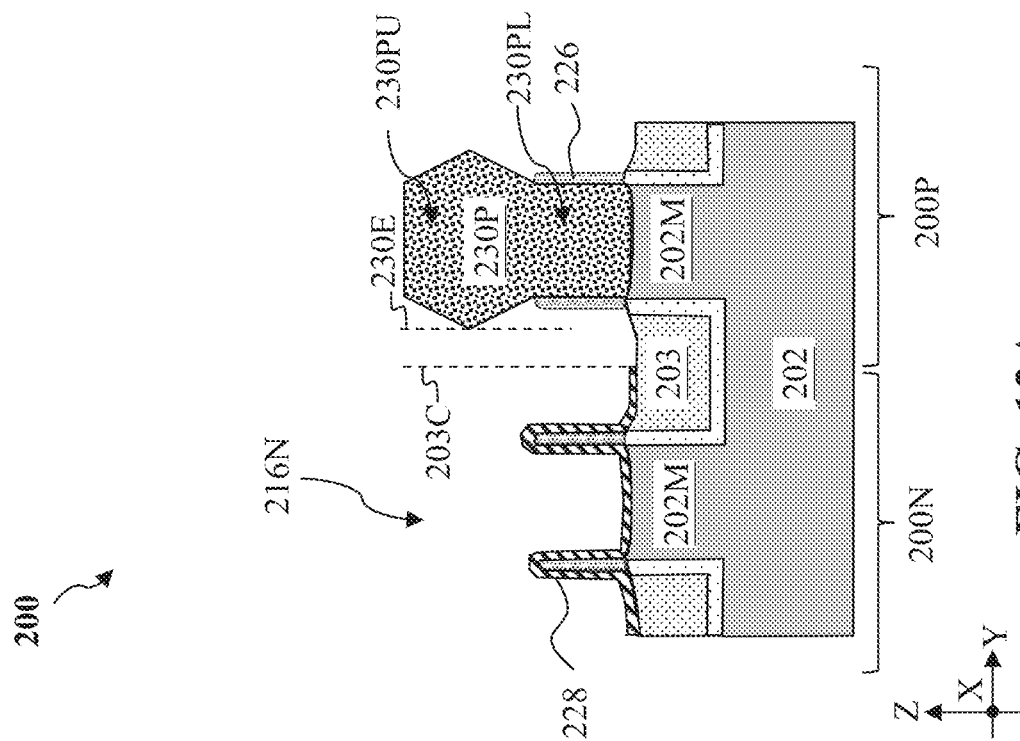

Referring now to FIGS. 1, 12A, and 12B, method 100 includes a block 118 where p-type source/drain features 230P are formed in source/drain openings 216P. The p-type source/drain features 230P may be epitaxially and selectively formed from exposed top surfaces of the substrate 202 and exposed sidewalls of the channel layers 208 by using an epitaxial process, such as VPE, UHV-CVD, MBE, and/or other suitable processes. The p-type source/drain features 230P are coupled to the channel layers 208 in the channel regions 205C over the second device region 200P and may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process.

When viewed from the X direction, as shown in FIG. 12A, the source/drain feature 230P includes a lower portion 230PL and an upper portion 230PU. A shape of the lower portion 230PL of the source/drain feature 230P tracks the shape of the lower portion of the source/drain opening 216P. That is, the lower portion 230PL of the source/drain feature 230P is sandwiched by two FSW spacers 226 along the Y direction, and the lower portion 230PL of the source/drain feature 230P has substantially vertical sidewalls in direct contact with inner sidewall surfaces of the FSW spacers 226. Since the FSW spacers 226 doesn't define edges of the upper portion of the source/drain opening 216P, the upper portion 230PU of the source/drain features 230P may grow laterally along the Y direction. By providing the FSW spacers 226, the starting point of the lateral growth of the source/drain feature 230P may be changed from the exposed top surface of the substrate 202 to the top surface of the lower portion 230PL of the source/drain feature 230P, and thus, in a limited duration for forming the source/drain feature 230P, the extent at which the upper portion 230PU of the source/drain feature 230P may grow along the Y direction is reduced, compared to embodiments where the workpiece 200 doesn't include FSW spacers 226. As shown in FIG. 12A, an edge of the upper portion 230PU of the source/drain feature 230P doesn't reach the central line 230M of the isolation structure 203, thereby preventing adjacent source/drain features from being merged. In embodiments represented in FIG. 12A, the upper portion 230PU of the source/drain features 230P resembles a hexagon shape. Other shapes may be possible. The first patterned mask film 228 may be removed after forming the source/drain features 230P.

Figure 13B:
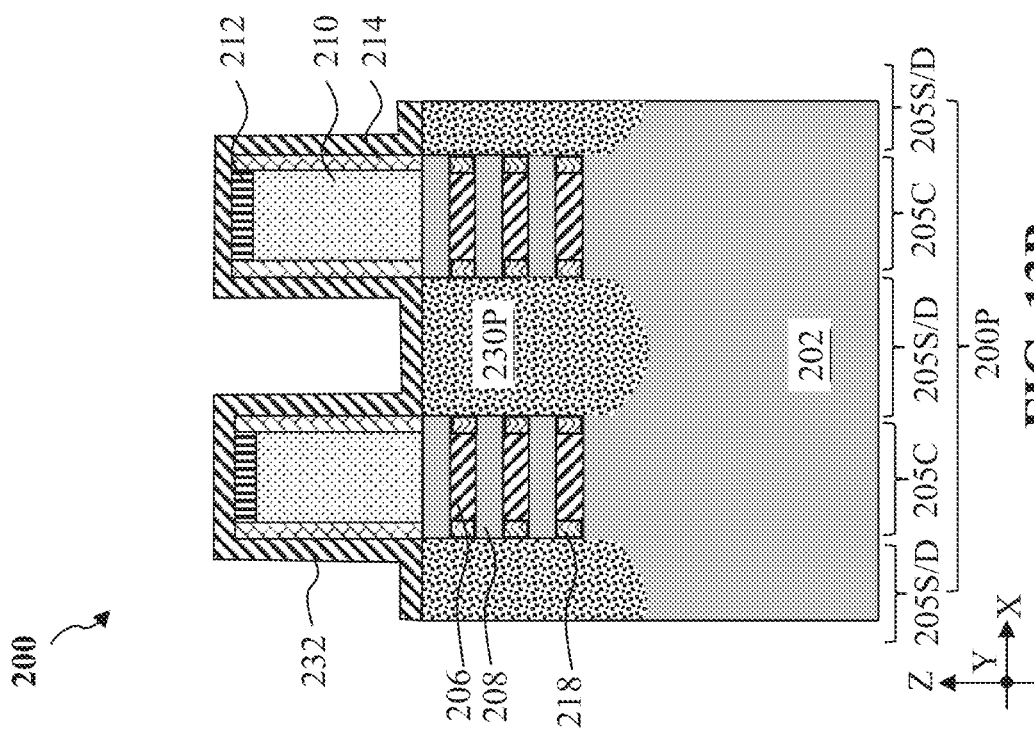
Figure 13A:
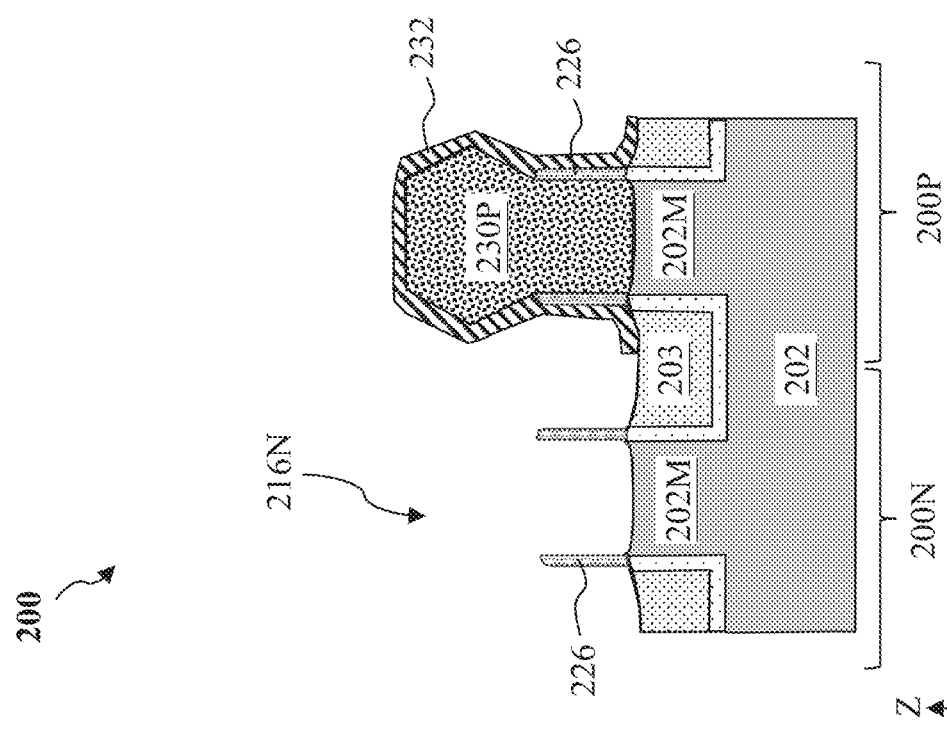

Referring now to FIGS. 1, 13A and 13B, method 100 includes a block 120 where a second patterned mask film 232 is formed over features in the second device region 200P while exposing the source/drain opening 216N in the first device region 200N. The formation and composition of the second patterned mask film 232 may be in a way similar to those of the first patterned mask film 228. As shown in FIG. 13A-13B, the second patterned mask film 232 covers/protects the source/drain features 230P and FSW spacers 226 in the second device region 200P while the source/drain opening 216N is exposed.

Figure 14B:
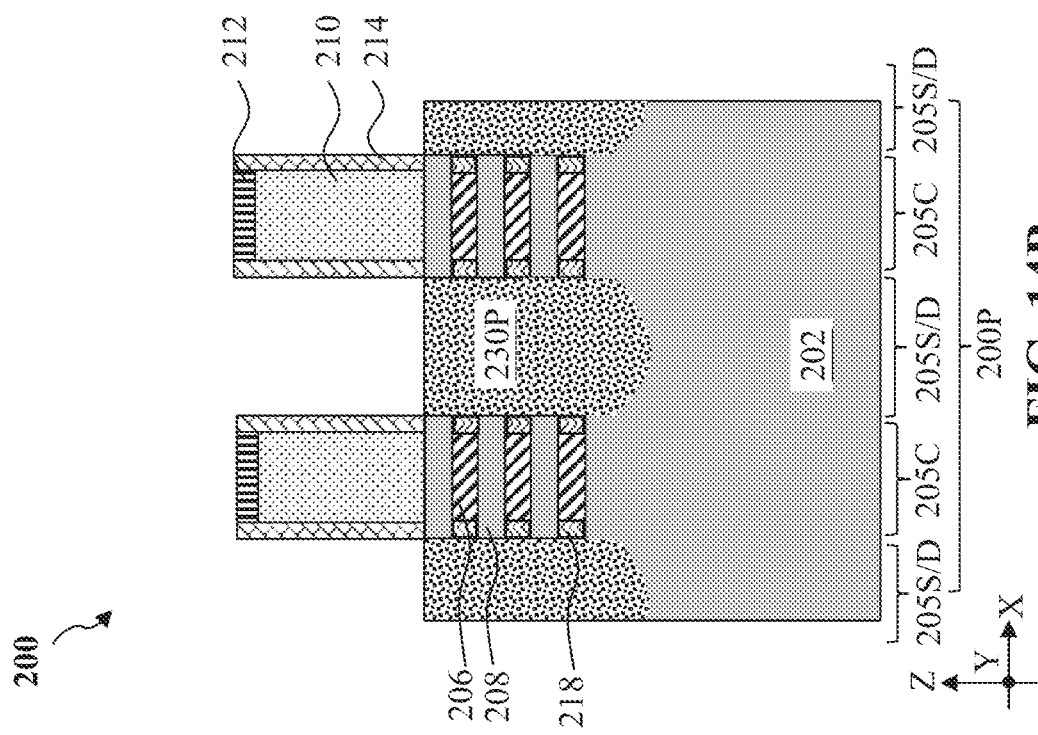
Figure 14A:
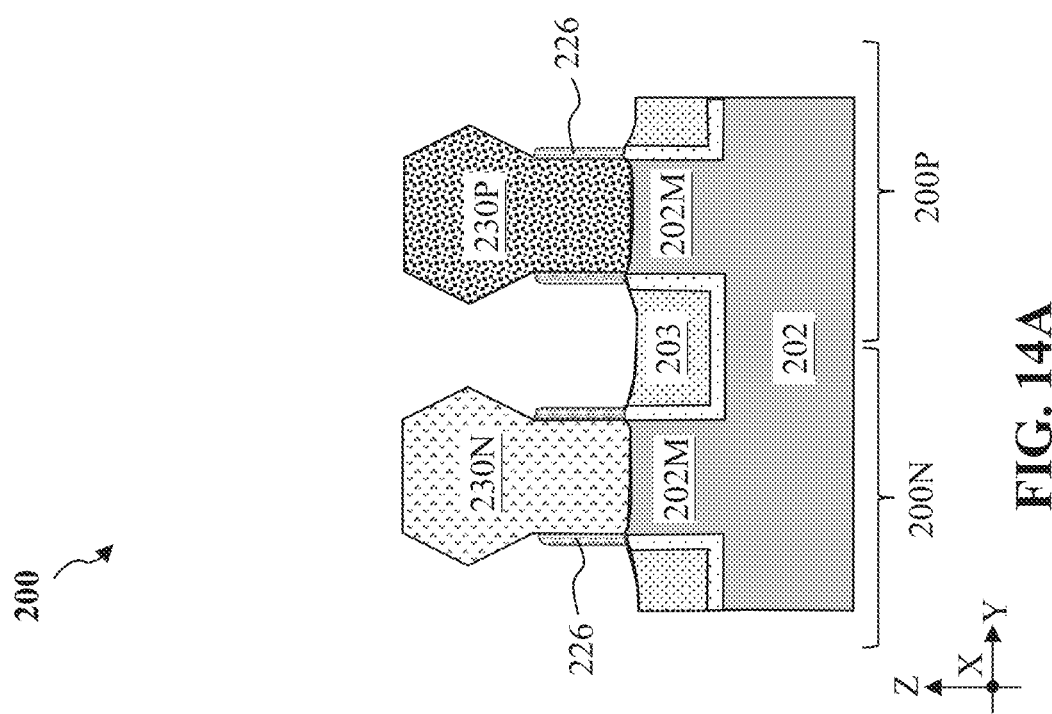

Referring now to FIGS. 1, 14A and 14B, method 100 includes a block 122 where n-type source/drain features 230N are formed in source/drain openings 216N. The n-type source/drain features 230N may be epitaxially and selectively formed from exposed top surfaces of the substrate 202 and exposed sidewalls of the channel layers 208 by using an epitaxial process, such as VPE, UHV-CVD, MBE, and/or other suitable processes. The n-type source/drain features 230N are coupled to the channel layers 208 in the channel regions 205C over the first device region 200N and may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. The shape of the n-type source/drain feature 230N is in a way similar to that of the p-type source/drain feature 230P described with reference to FIG. 12 and detailed descriptions are omitted for reason of simplicity. By providing the FSW spacers 226, the extent at which the source/drain features 230N may grow laterally along the Y direction is reduced. cross-sectional view of the workpiece taken along line C-C (shown in FIG. 10) is omitted for reason of simplicity. The second patterned mask film 232 may be removed after forming the source/drain features 230N.

Referring now to FIGS. 1, 15A, 15B, 16A, 16B, and 17, method 100 includes a block 124 where the dummy gate structures 210 and the sacrificial layers 206 are removed and gate stacks 240N and 240P are formed. As shown in FIGS. 15A-15B, a contact etch stop layer (CESL) 236 and an interlayer dielectric (ILD) layer 238 are deposited over the workpiece 200. The CESL 236 may include silicon nitride, silicon oxynitride, and/or other suitable materials and may be formed by atomic layer deposition (ALD) process, plasma-enhanced chemical vapor deposition (PECVD) process and/or other suitable deposition or oxidation processes. The ILD layer 238 is deposited by a flowable CVD (FCVD), a CVD process, a PVD process, or other suitable deposition technique over the workpiece 200 after the deposition of the CESL 236. The ILD layer 238 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. After depositing the CESL 236 and the ILD layer 238, as shown in FIG. 15B, a planarization process (e.g., chemical mechanical polishing CMP) may performed to remove excess materials (including the gate-top hard mask layer 212) to expose the dummy gate electrode layer of the dummy gate structure 210.

Figures 16A, 16B:
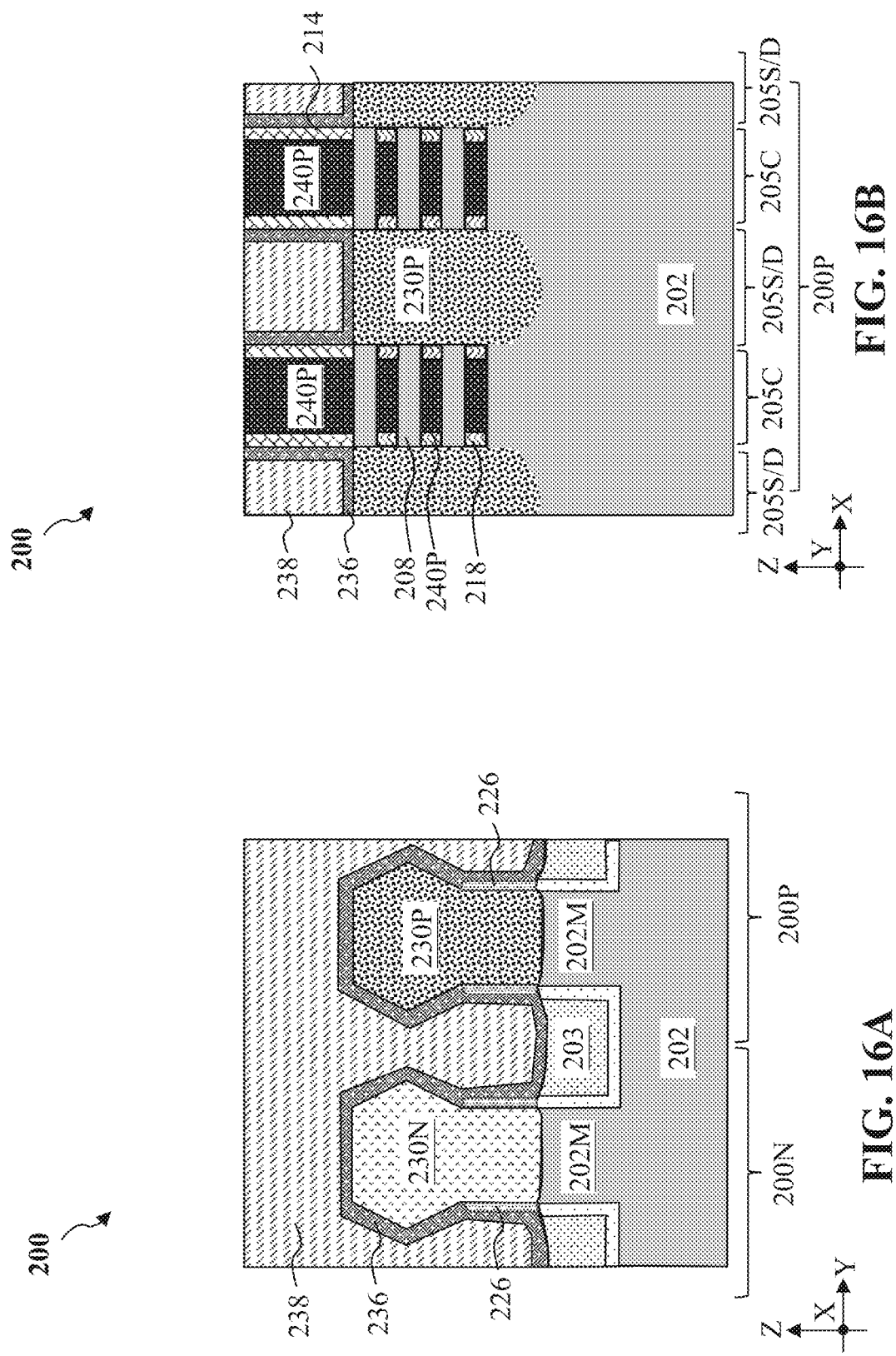
Figure 17:
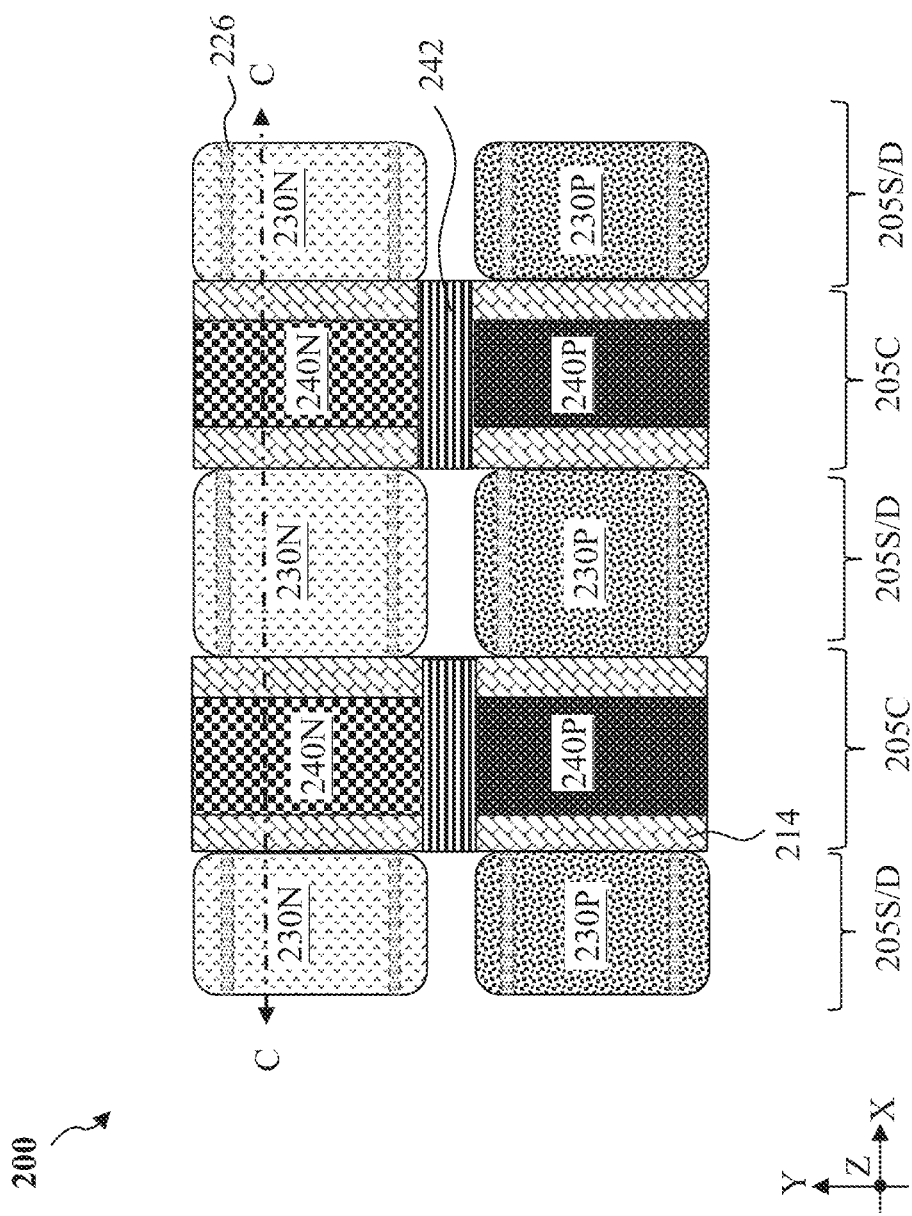
FIG. 17 illustrates a fragmentary top view of the workpiece shown in FIGS. 16A and 16B, according to various aspects of the present disclosure.

Referring to FIGS. 16B and 17, with the exposure of the dummy gate electrode layer, block 124 proceeds to removal of the dummy gate structures 210. The removal of the dummy gate structures 210 may include one or more etching process that are selective to the material in the dummy gate structures 210. For example, the removal of the dummy gate structures 210 may be performed using a selective wet etch, a selective dry etch, or a combination thereof. After the removal of the dummy gate structures 210, the sacrificial layers 206 are selectively removed to release the channel layers 208 as channel members 208 in the channel regions 205C. The selective removal of the sacrificial layers 206 may be implemented by a selective dry etch, a selective wet etch, or other selective etching process. In some embodiments, the selective wet etching includes an APM etch (e.g., ammonia hydroxide-hydrogen peroxide-water mixture).

Gate stacks 240P are formed to wrap over the channel members 208 in the second device region 200P and gate stacks 240N are formed to wrap over the channel members 208 in the first device region 200N. FIG. 16B depicts a cross-sectional view of the workpiece 200 taken along line B-B, and a cross-sectional view of the workpiece 200 taken along line C-C (shown in FIGS. 10 and 17) is omitted for reason of simplicity. Each of the gate stacks 240P and 240N includes a gate dielectric layer (not separately shown) and a gate electrode layer (not separately shown) over the gate dielectric layer. In some embodiments, the gate dielectric layer includes an interfacial layer disposed on the channel members 208 and a high-k dielectric layer over the interfacial layer. Here, a high-k dielectric layer refers to a dielectric material having a dielectric constant greater than that of silicon dioxide, which is about 3.9. A low-k dielectric layer refers to a dielectric material having a dielectric constant no greater than that of silicon dioxide. In some embodiments, the interfacial layer includes silicon oxide. The high-k dielectric layer is then deposited over the interfacial layer using ALD, CVD, and/or other suitable methods. The high-k dielectric layer may include hafnium oxide. Alternatively, the high-k dielectric layer may include other high-k dielectrics, such as titanium oxide, hafnium zirconium oxide, tantalum oxide, hafnium silicon oxide, zirconium silicon oxide, lanthanum oxide, aluminum oxide, yttrium oxide, $SrTiO_3$, $BaTiO_3$, $BaZrO$, hafnium lanthanum oxide, lanthanum silicon oxide, aluminum silicon oxide, hafnium tantalum oxide, hafnium titanium oxide, $(Ba,Sr)TiO_3$ (BST), silicon nitride, silicon oxynitride, combinations thereof, or other suitable material.

The gate electrode layer is then deposited over the gate dielectric layer using ALD, PVD, CVD, e-beam evaporation, or other suitable methods. The gate electrode layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. Different gate electrode layers may be formed separately for the gate stacks 240N of n-type transistors in the first device region 200N and gate stacks 240P of p-type transistors in the second device region 200P. By way of example, the gate electrode layers may include titanium nitride, titanium aluminum, titanium aluminum nitride, tantalum nitride, tantalum aluminum, tantalum aluminum nitride, tantalum aluminum carbide, tantalum carbonitride, aluminum, tungsten, nickel, titanium, ruthenium, cobalt, platinum, tantalum carbide, tantalum silicon nitride, copper, other refractory metals, or other suitable metal materials or a combination thereof. FIG. 17 depicts a top view of the workpiece 200 shown in FIGS. 16A and 16B. In some implementations, after forming the gate stacks 240N and the gate stacks 240P, dielectric structures 242 may be formed to electrically and physically isolate two adjacent gate structures (e.g., gate stacks 240N and 240P).

Figures 18A, 18B:
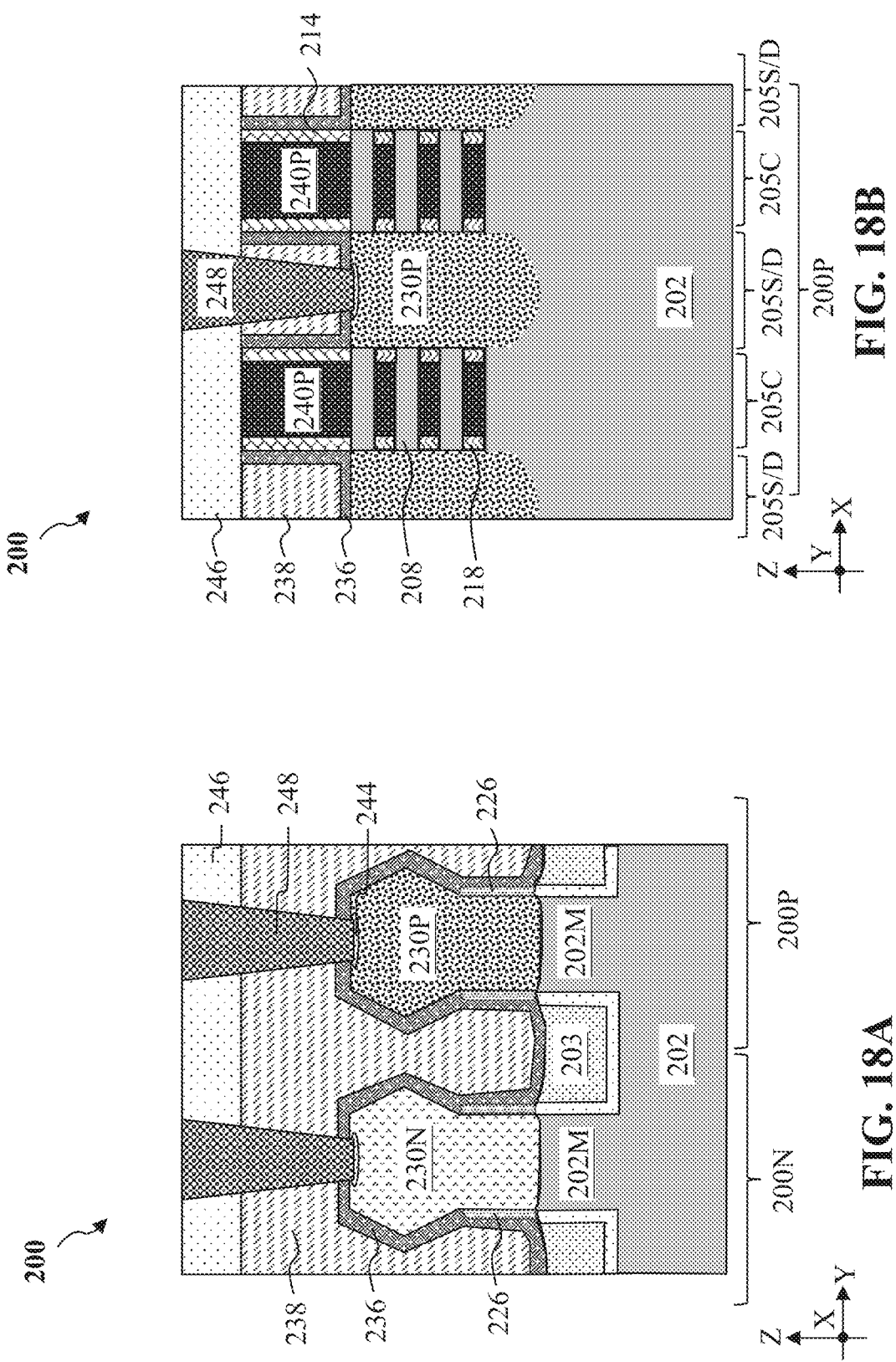

Referring to FIGS. 1, 18A and 18B, method 100 includes a block 126 where further processes are performed. Such further processes may include recessing top portions of the gate stacks 240N and 240P and forming corresponding self-aligned capping (SAC) dielectric layers (not depicted) over the recessed gate stacks, forming silicide layers 244 over the source/drain features 230N/230P, forming device-level contacts (such as source/drain contacts 248) over the source/drain features and gate contact vias (not shown) over the gate stacks. Such further processes may also include forming a multi-layer interconnect (MLI) structure (not depicted) over the workpiece 200. The MLI may include various interconnect features, such as vias and conductive lines, disposed in dielectric layers, such as etch-stop layers and ILD layers (such as ILD layer 246). In some embodiments, the vias are vertical interconnect features configured to interconnect the device-level contacts.

Figures 19A, 19B:
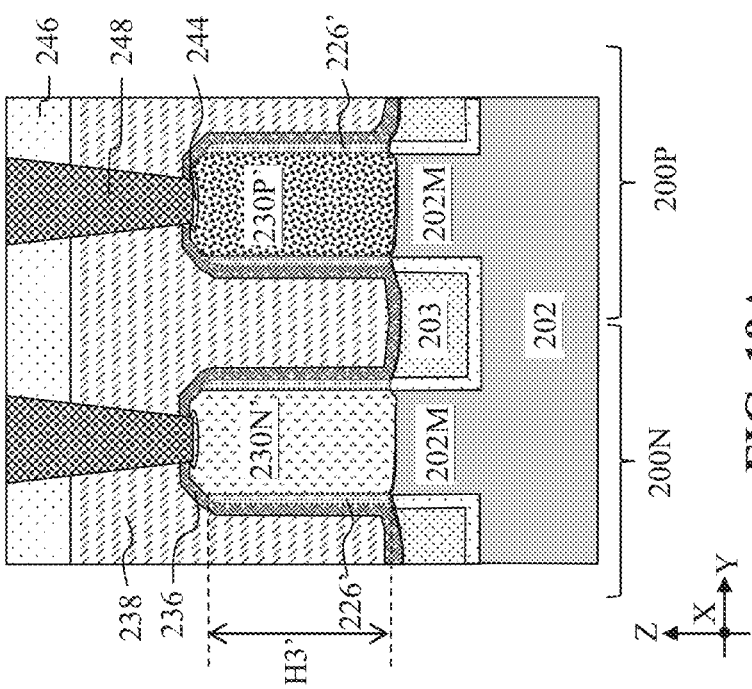
FIG. 19A illustrates a fragmentary cross-sectional view of a first alternative workpiece taken along line A-A as shown in FIG. 10, according to various aspects of the present disclosure.
FIG. 19B illustrates a fragmentary cross-sectional view of a second alternative workpiece taken along line A-A as shown in FIG. 10, according to various aspects of the present disclosure.

In embodiments described above, the height H1 of the sacrificial structure 220 is smaller than the depth D1 of the source/drain opening 216P/216N, and the corresponding source/drain feature 230P/230N includes the lower portion (e.g., lower portion 230PL shown in FIG. 12A) having substantially vertical sidewalls 220S and the upper portion (e.g., upper portion 230PU shown in FIG. 12A) having a width greater than the width W1 of the lower portion to provide the source/drain feature 230P/230N a satisfactory volume. In some other implementations, to form source/drain features in semiconductor devices having more densely spaced active regions (i.e., a reduced spacing S1), a part or an entirety of the laterally growth of the upper portion of the source/drain features may further be reduced or substantially eliminated. By adjusting the height H1 of the sacrificial structure 220, the corresponding height H3 of the FSW spacers 226 may be adjusted, and the height of the lower portion of the source/drain features (that have substantially vertical sidewalls 220S) can be adjusted accordingly to form satisfactory source/drain features. For example, the FSW spacer 226 may have a height H3 that is substantially equal to the depth D1 of the source/drain opening 216P/216N, thereby forming source/drain features whose entire sidewall surfaces are substantially vertical. FIG. 19A depicts a cross-sectional view of a workpiece 200 that includes FSW spacers 226' and source/drain features 230N'/230P'. The formations and compositions of the FSW spacers 226' and the source/drain features 230N'/230P' may be in a way similar to those of the FSW spacers 226 and source/drain features 230N/230P, and detailed description is omitted for reason of simplicity. The FSW spacers 226' having a height H3' that is substantially equal to the depth D1 of the source/drain opening 216N/216P. As a result, when viewed from the X direction, almost the whole sidewall surface of the source/drain feature 230N'/230P' is substantially vertical along the Z direction. FIG. 19B depicts a cross-sectional view of a workpiece 200 that includes a FSW spacer having a multi-layer structure. For example, the FSW spacer includes a first layer 226a and a second layer 226b. The second layer 226b is spaced apart from the source/drain feature 230N/230P by the first layer 226a. A composition of the first layer 226a may be different from a composition of the second layer 226b to increase the etching resistivity of the FSW spacer. In embodiments represented in FIG. 19B, the source/drain features 230N/230P each also includes a lightly doped region 230NL' and 230PL' to reduce current leakage.

In embodiments described with reference to FIGS. 18A, 19A and 19B, the epitaxial growth of the sacrificial structures 220 is controlled such that the sacrificial structures 220 don't grow laterally along the Y direction, and the corresponding FSW spacers 226 have substantially vertical sidewalls, thereby forming satisfactory source/drain features. As described above, the volume of the source/drain feature affect the parasitic resistance. To form a satisfactory source/drain feature with a reduced parasitic resistance, in some other implementations, the epitaxial growth of the sacrificial structures 220 may be controlled such that the sacrificial structures 220 may have an acceptable lateral growth to increase the volume of the source/drain feature while preventing the merge of two adjacent source/drain features.

Figure 20B:
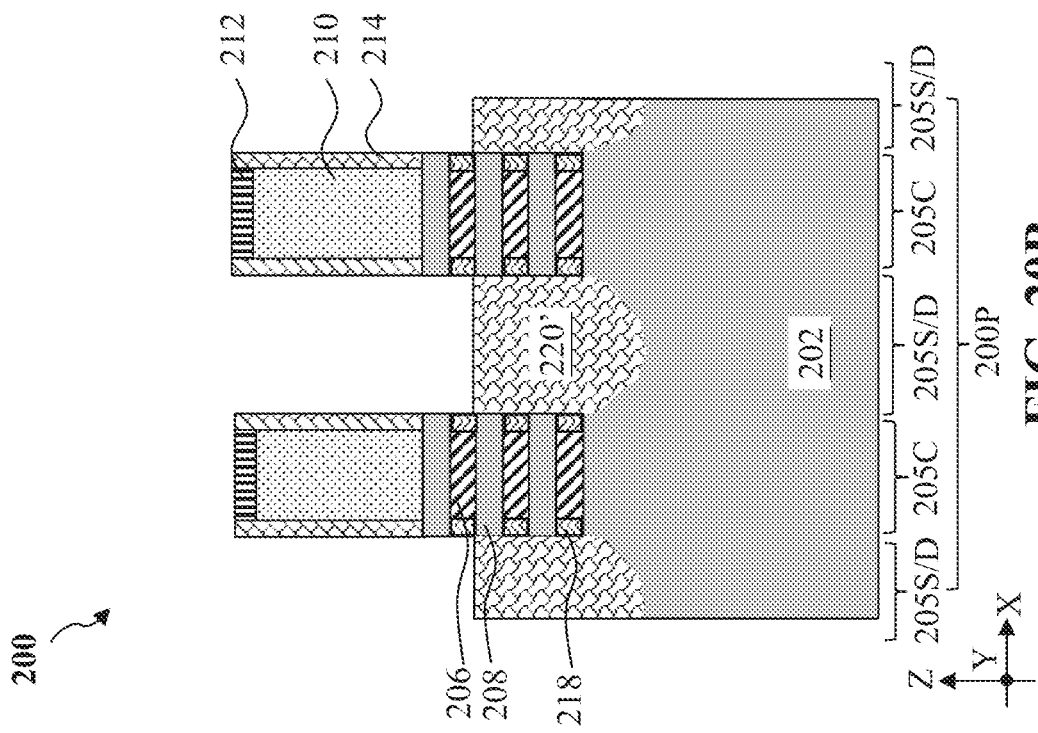
FIGS. 20B and 21B illustrate fragmentary cross-sectional views of the third alternative workpiece taken along line B-B as shown in FIG. 10 during various fabrication stages in the method of FIG. 1, according to various aspects of the present disclosure.
Figure 20A:
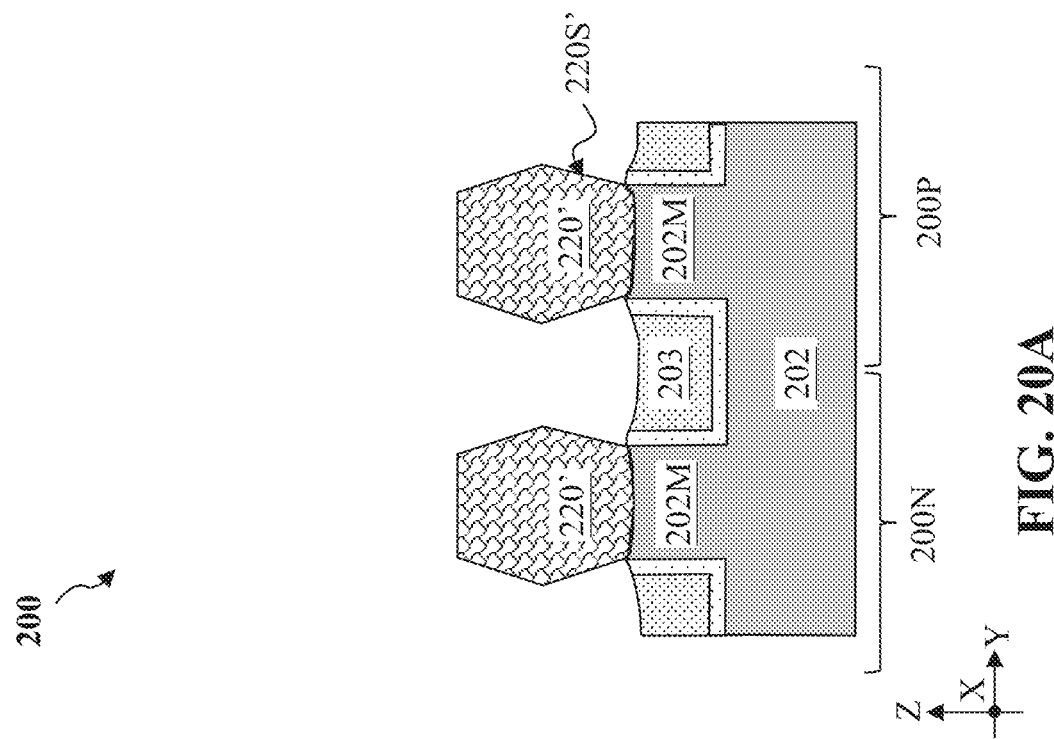
FIGS. 20A and 21A illustrate fragmentary cross-sectional views of a third alternative workpiece taken along line A-A as shown in FIG. 10 during various fabrication stages in the method of FIG. 1, according to various aspects of the present disclosure.

FIGS. 20A-20B depict cross-sectional views of the workpiece 200 after the formation of sacrificial structures 220'. In embodiments represented in FIG. 20A, a shape of a cross-sectional view of the sacrificial structure 220' resembles a hexagon shape, and the sacrificial structure 220' includes a sidewall surface 220S' tilted outwardly from bottom to top. In some implementations, to form the sacrificial structures 220', a concentration of one or more species of precursors (e.g., silane ($SiH_4$)) in this bottom-up growth process 219 may be greater than a concentration of one or more species of precursors in the bottom-up growth process 219 (shown in FIG. 7A) for forming the sacrificial structures 220. After forming the sacrificial structure 220', operations in blocks 112-122 of method 100 may be applied to the workpiece 200 shown in FIG. 20A to form the source/drain feature 230N''/230P''. As depicted in FIG. 21A, the workpiece 200 includes FSW spacers 226'' sandwiching the lower portion of the source/drain feature 230N''/230P''. The FSW spacers 226'' tilted outwardly from bottom to top, and accordingly, the lower portion of the source/drain feature 230N''/230P'' has a width gradually increases from bottom to top. Due to the formation of the tilted FSW spacers 226'', the volume of the source/drain feature 230N''/230P'' is increased and thus greater than the volume of the source/drain feature 230N/230P, thereby reducing a parasitic resistance of the workpiece 200 without causing the merge between two adjacent source/drain features. Operations in blocks 124-126 of method 100 may be applied to finish the fabrication of the semiconductor structure 200.

In embodiments described above with reference to FIG. 1, method 100 may be applied to form FSW spacers (such as FSW spacers 226, 226', 226") with the same height and same composition in the first device region 200N and the second device region 200P. FIG. 22 depicts an alternative method 300 for forming a semiconductor structure 400 with FSW spacers, where the FSW spacers in the first device region 200N and the second device region 200P may have different heights and/or different compositions. More specifically, after performing the operations in block 110 in method 100, instead of performing operations in blocks 112, 114, 116, 118, 120, and 122 in method 100, method 300 is employed to form the alternative FSW spacers.

Figures 23A, 23B:
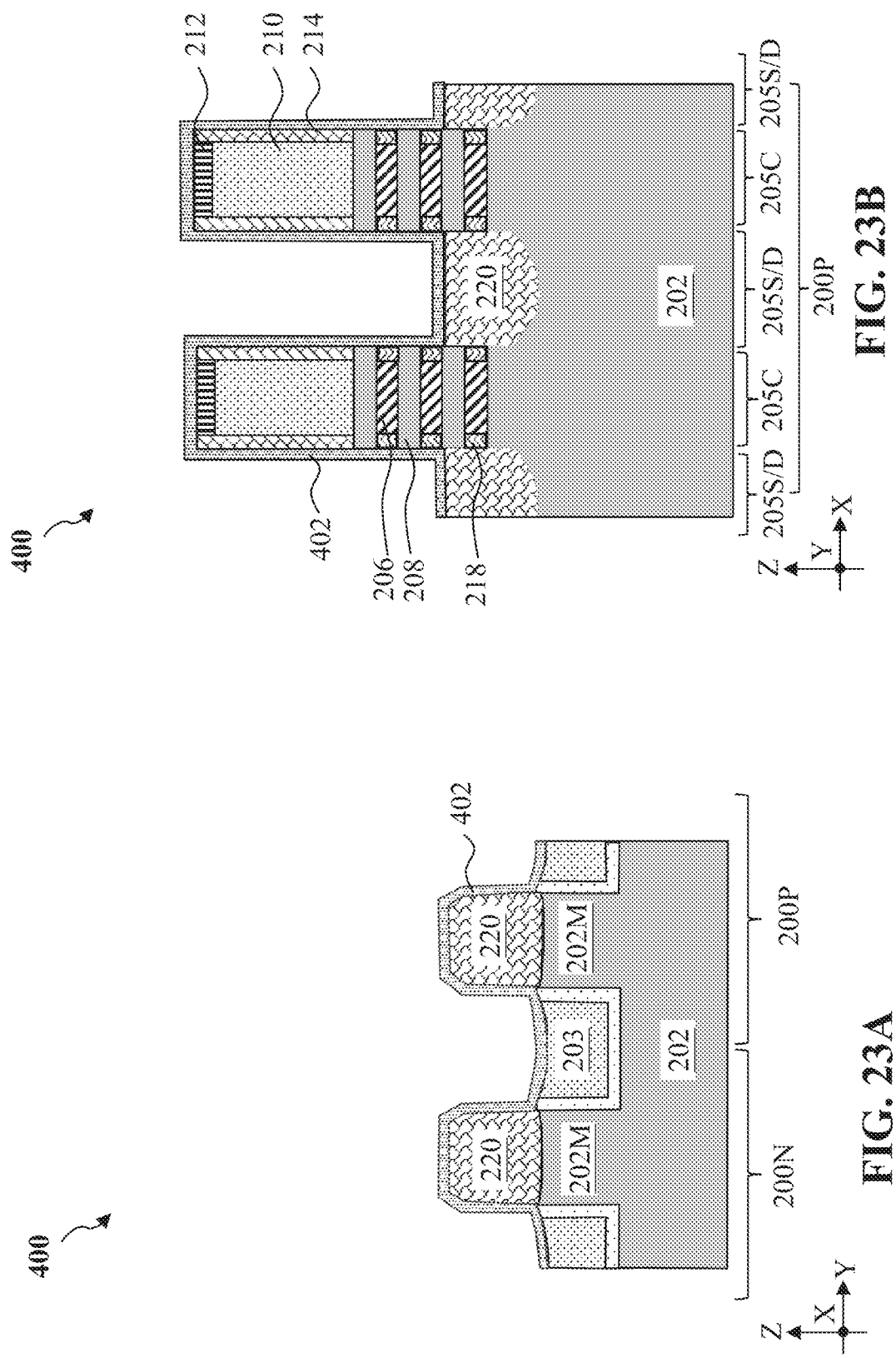

Referring now to FIGS. 22, 23A and 23B, after forming the sacrificial structures 220, method 300 includes a block 302 where a first dielectric film 402 is deposited over the workpiece 400. The formation of the first dielectric film 402 may be in a way similar to that of the dielectric film 222 described with reference to FIGS. 8A and 8B. In some embodiments, the first dielectric film 402 may include a dielectric material that has, for example, aluminum (Al), titanium (Ti), lithium (Li), hafnium (Hf), zirconium (Zr), lanthanum (La), molybdenum (Mo), cobalt (Co), silicon (Si), oxygen (O), nitrogen (N), carbon (C), any other suitable elements, or combinations thereof. For example, the first dielectric film 402 may include aluminum oxide ($Al_2O_3$), hafnium oxide ($HfO_2$), silicon oxycarbide (SiOC), or silicon oxynitride (SiON).

Referring now to FIGS. 22, 24A and 24B, method 300 includes a block 304 where a first patterned mask film 404 is formed over the portion of the first dielectric film 402 in the second device region 200P while exposing the portion of the first dielectric film 402 in the first device region 200N. The formation and composition of the first patterned mask film 404 may be in a way similar to those of the patterned mask film 228 described with reference to FIGS. 11A and 11B.

Figure 25B:
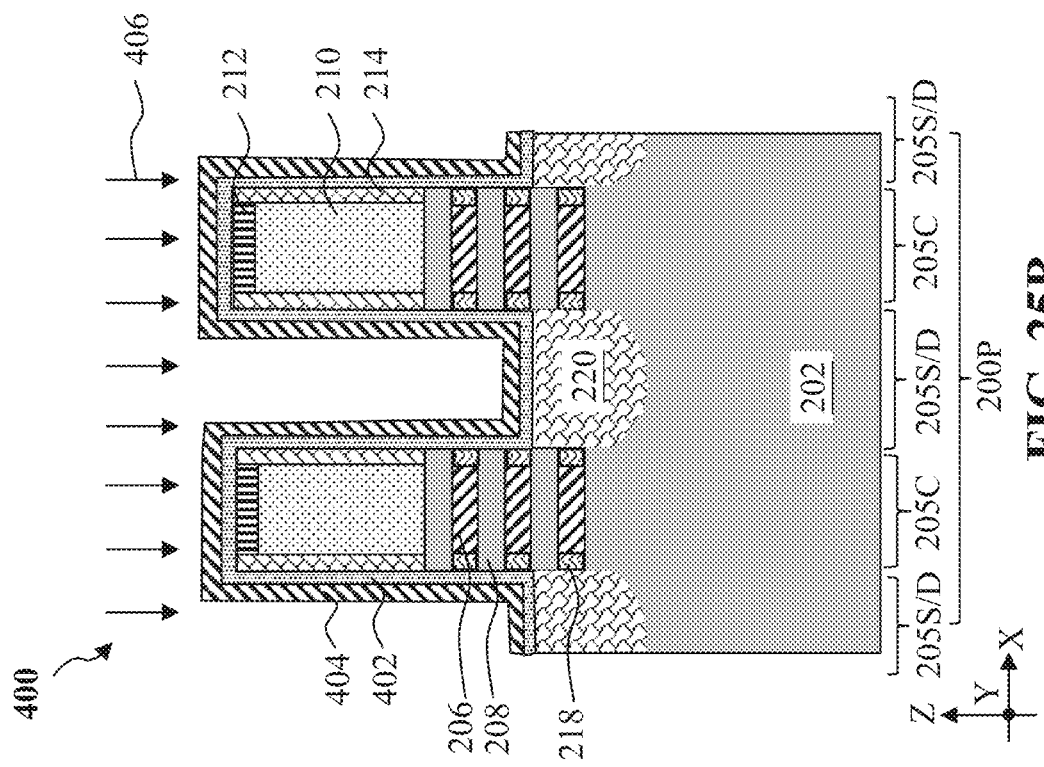
Figure 25A:
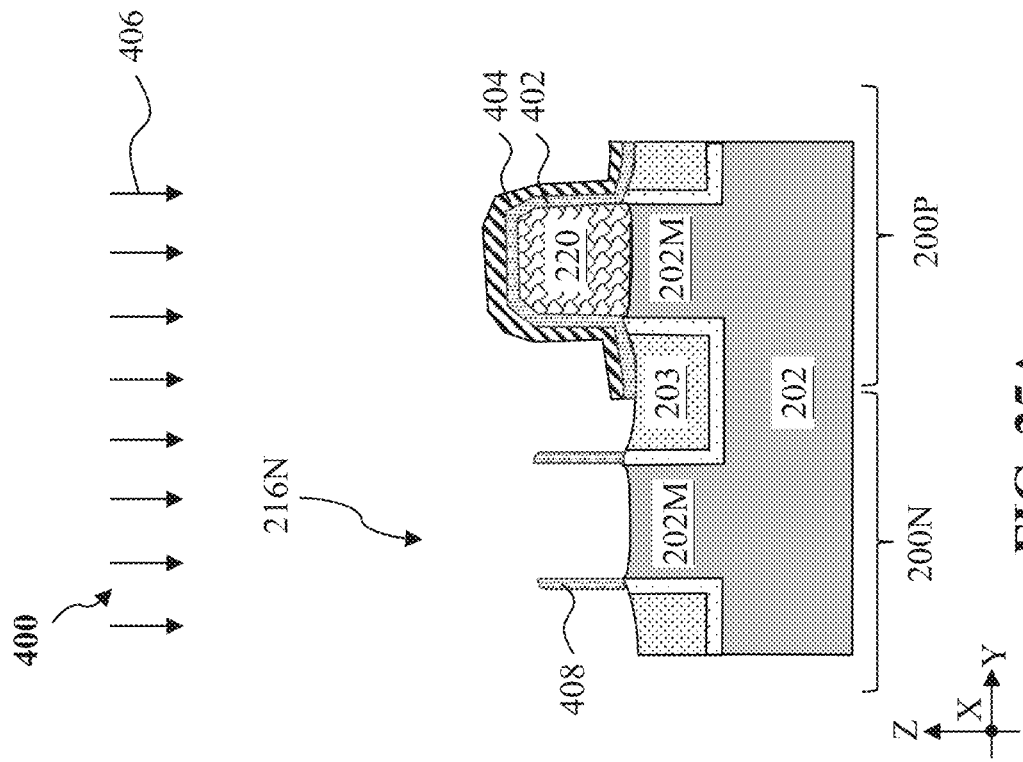

Referring now to FIGS. 22, 25A and 25B, method 300 includes a block 306 where a first etching process 406 is performed to the workpiece 400 to form a number of first FSW spacers 408 in the first device region 200N. The first etching process 406 may be in a way similar to the etching process 224 described with reference to FIGS. 9A and 9B. In some embodiments, the sacrificial structures 220 in the first device region 200N may be removed by the first etching process 406 or by another etching process. The first patterned mask film 404 may be removed after forming the first FSW spacers 408 in the first device region 200N.

Figure 26B:
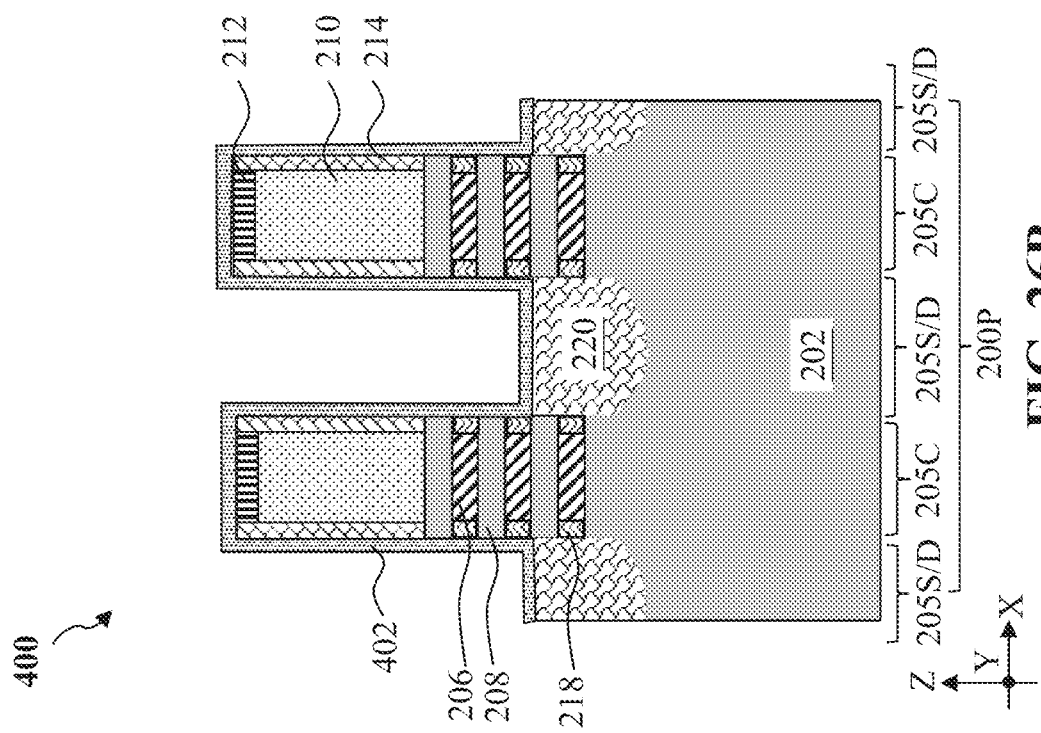
Figure 26A:
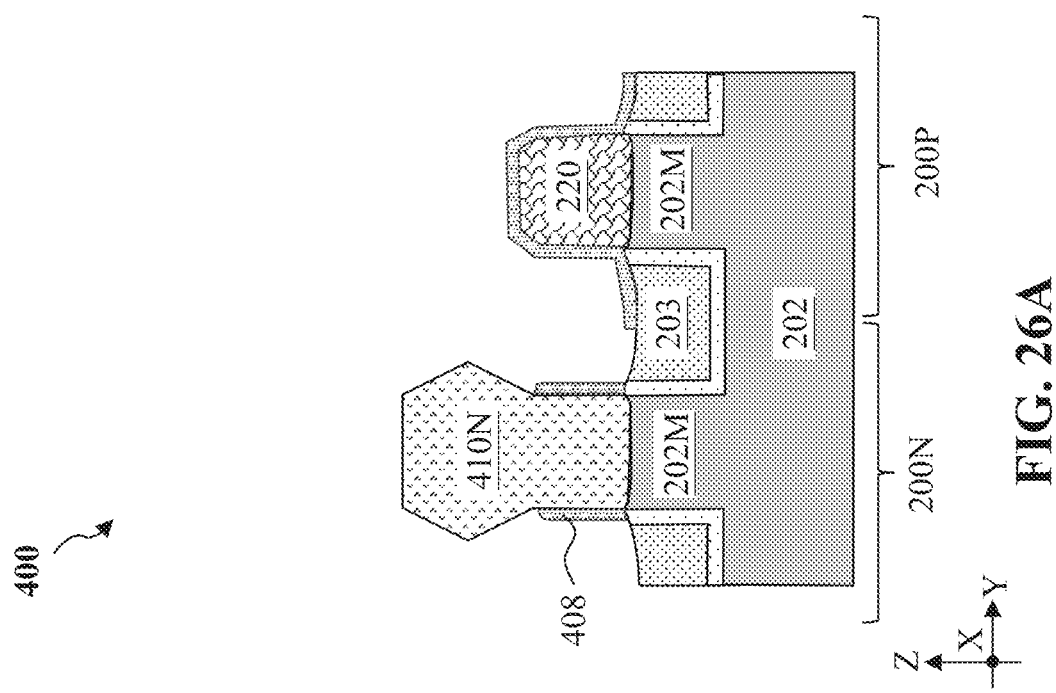

Referring now to FIGS. 22, 26A and 26B, method 300 includes a block 308 where n-type source/drain features 410N are formed in the source/drain openings 216N in the first device region 200N. The n-type source/drain features 410N may be formed in a way similar to the n-type source/drain features 230N described with reference to FIG. 14A and may be in-situ doped during the epitaxial process by introducing an n-type dopant, such as phosphorus, arsenic, or antimony, or ex-situ doped using a junction implant process. The shape of the cross-sectional view of the n-type source/drain feature 410N is in a way similar to that of the p-type source/drain feature 230P described with reference to FIG. 12 and detailed descriptions are omitted for reason of simplicity.

Figure 27B:
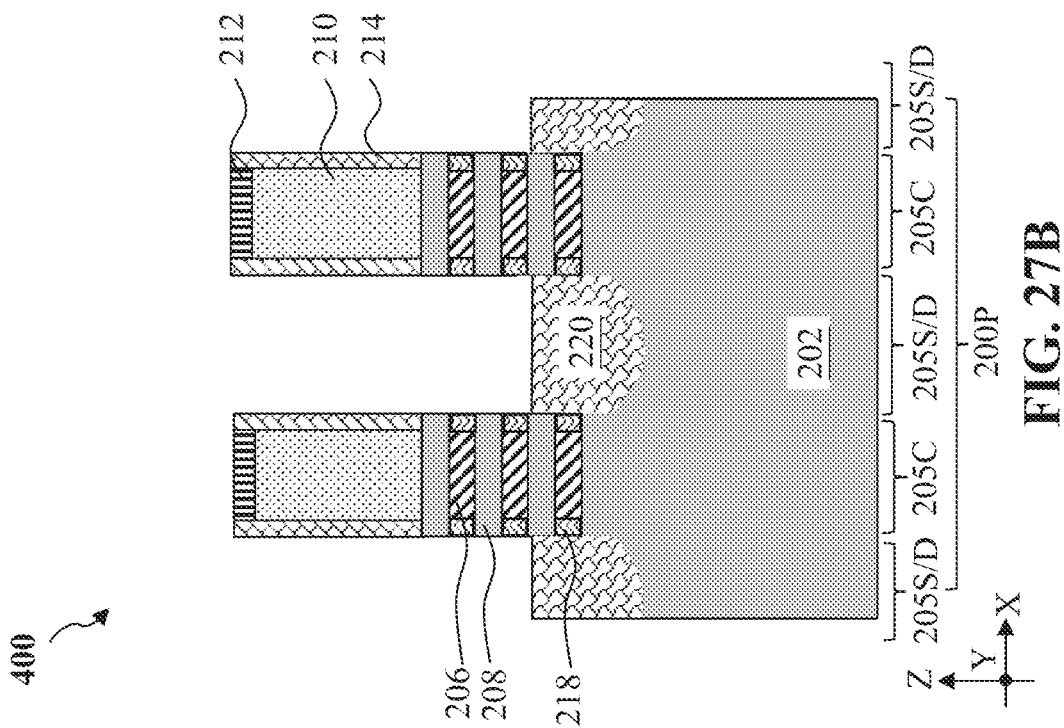
Figure 27A:
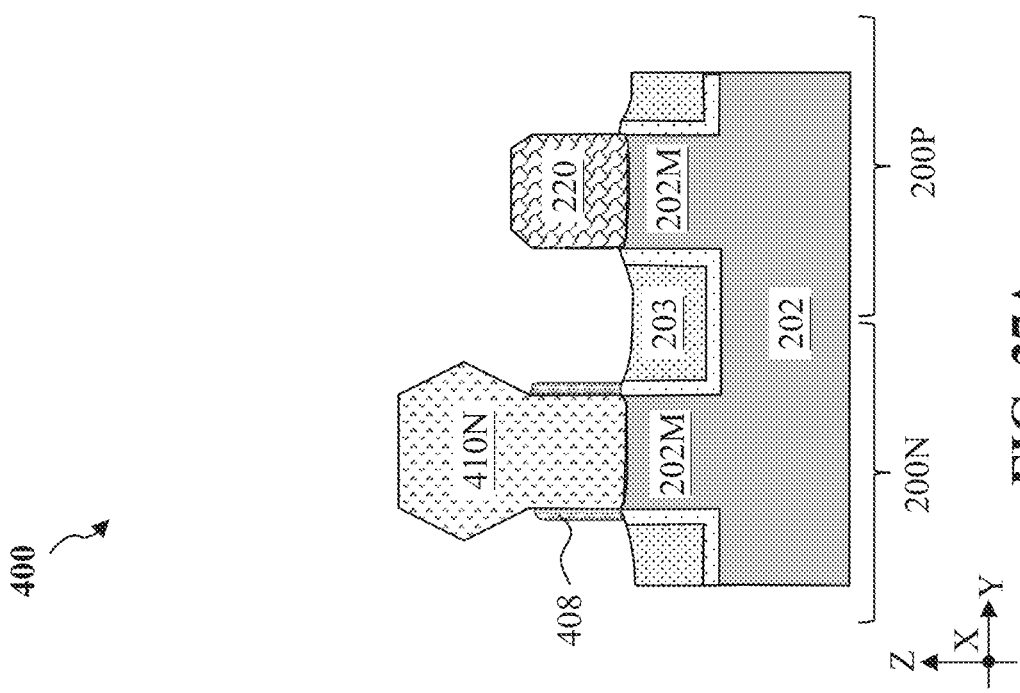

As shown in FIGS. 27A and 27B, after forming the n-type source/drain features 410N in the first device region 200N, the first dielectric film 402 in the second device region 200P may be removed. The removal of the first dielectric film 402 in the second device region 200P may include processes such as deposition, patterning, etching, and/or other suitable processes.

Figure 28B:
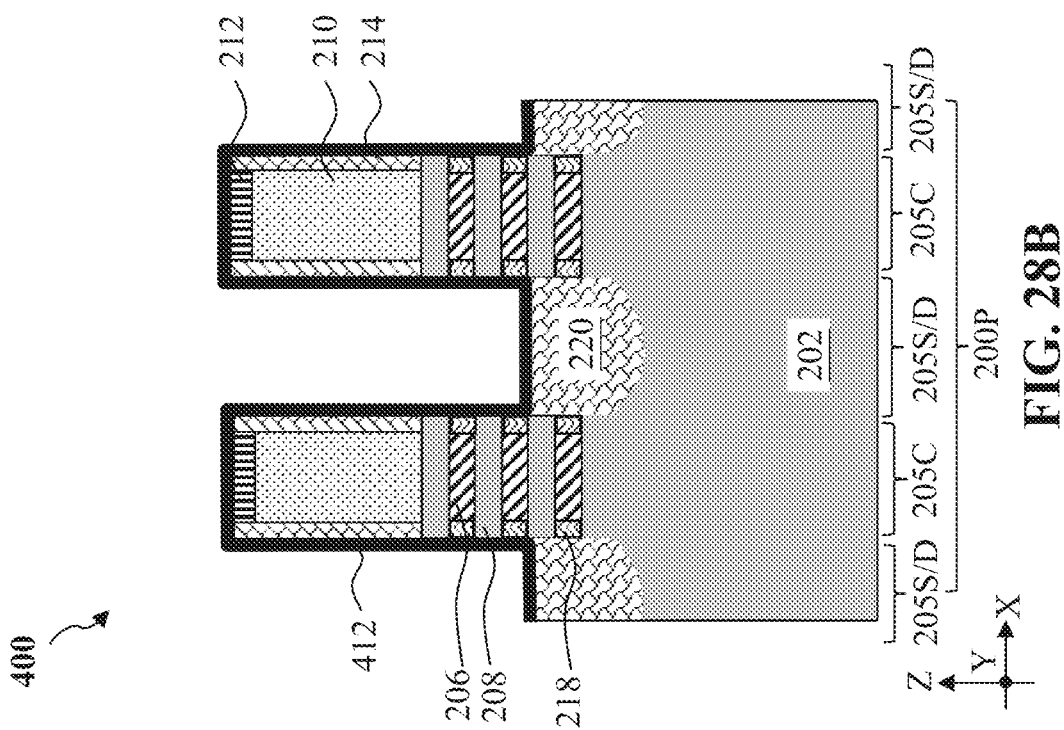
Figure 28A:
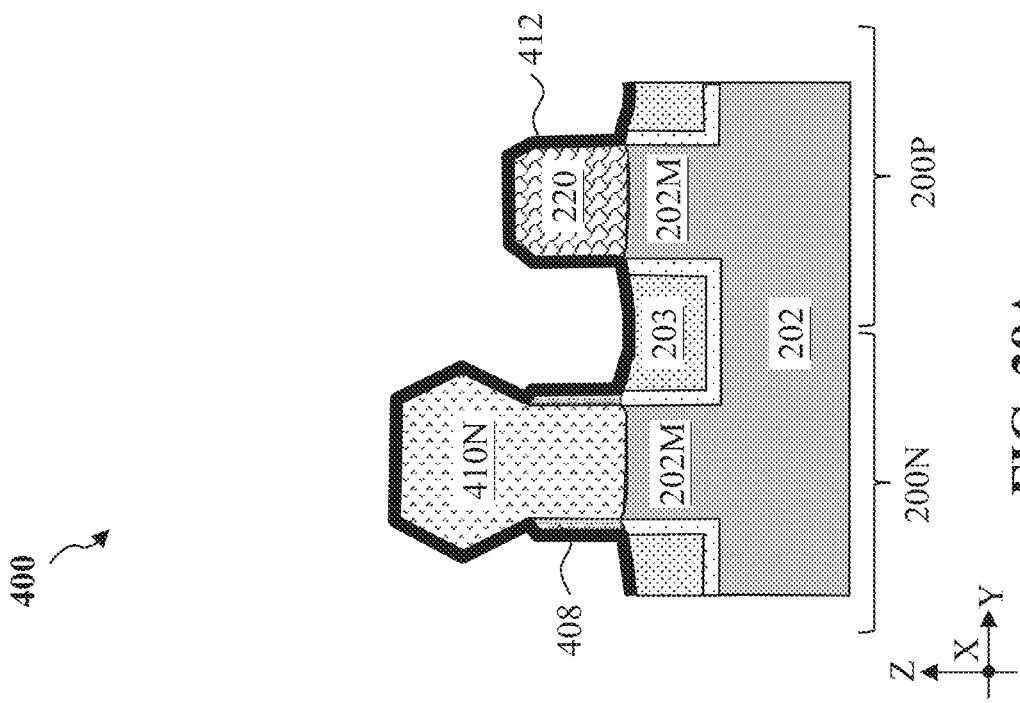

Referring now to FIGS. 22, 28A and 28B, method 300 includes a block 310 where a second dielectric film 412 is deposited over the workpiece 400. The formation of the second dielectric film 412 may be in a way similar to that of the dielectric film 222 described with reference to FIGS. 8A and 8B. The second dielectric film 412 covers both the n-type source/drain features 410N in the first device region 200N and the sacrificial structures 220 in the second device region 200P. In some embodiments, the second dielectric film 412 may include a dielectric material that has, for example, aluminum (Al), titanium (Ti), lithium (Li), hafnium (Hf), zirconium (Zr), lanthanum (La), molybdenum (Mo), cobalt (Co), silicon (Si), oxygen (O), nitrogen (N), carbon (C), any other suitable elements, or combinations thereof. For example, the second dielectric film 412 may include aluminum oxide ($Al_2O_3$), hafnium oxide ($HfO_2$), silicon oxycarbide (SiOC), or silicon oxynitride (SiON). A composition of the second dielectric film 412 may be different from a composition of the first dielectric film 402. For example, in an embodiment, the first dielectric film 402 may include hafnium oxide, and the second dielectric film 412 may include silicon oxynitride.

Figure 29B:
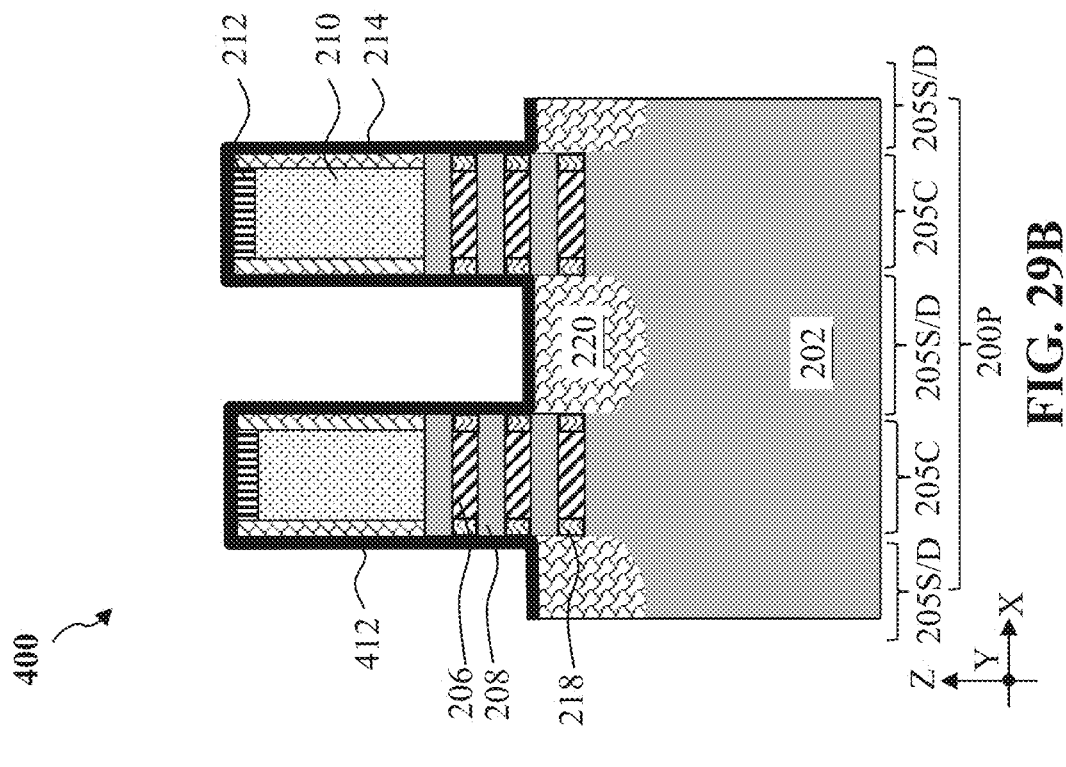
Figure 29A:
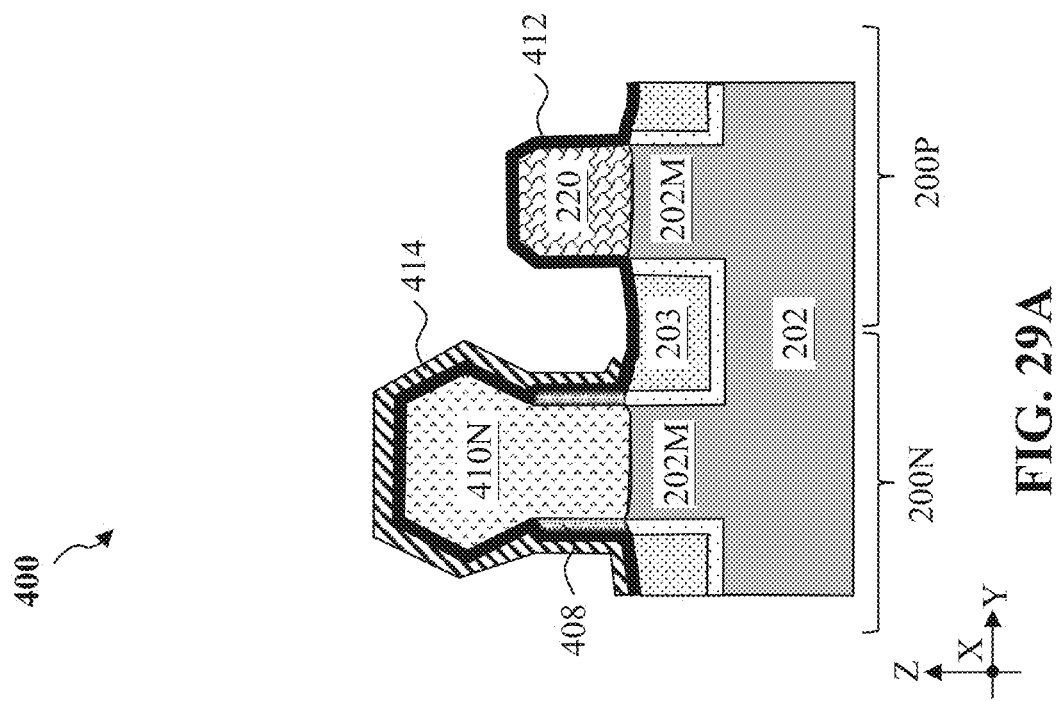

Referring now to FIGS. 22, 29A and 29B, method 300 includes a block 312 where a second patterned mask film 414 is formed over the portion of the second dielectric film 412 in the first device region 200N while exposing the portion of the second dielectric film 412 in the second device region 200P. The formation and composition of the second patterned mask film 414 may be in a way similar to those of the patterned mask film 228 described with reference to FIGS. 11A and 11B.

Figure 30B:
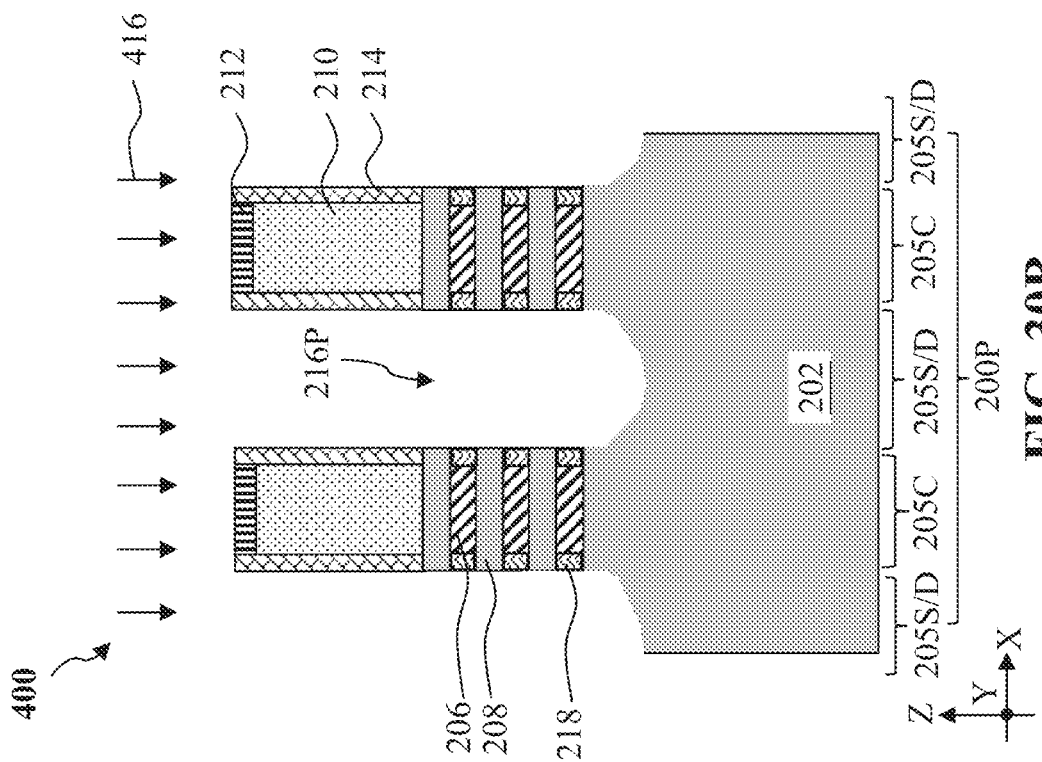
Figure 30A:
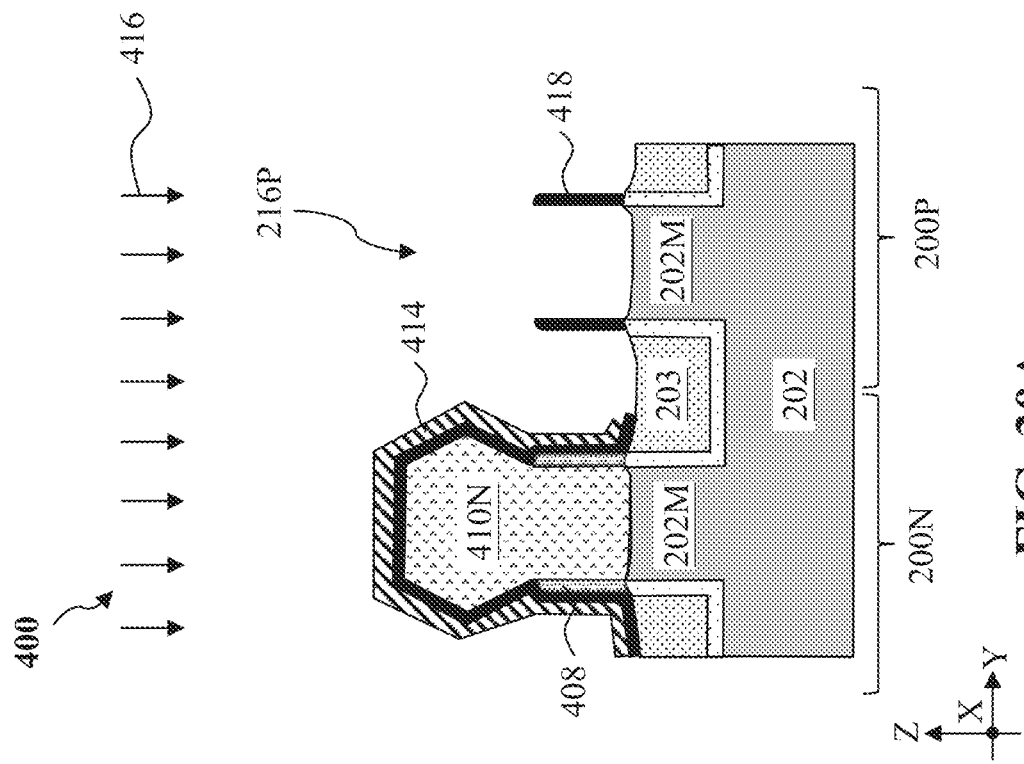

Referring now to FIGS. 22, 30A and 30B, method 300 includes a block 314 where a second etching process 416 is performed to the workpiece 400 to form a number of second FSW spacers 418 in the second device region 200P. While using the second patterned mask film 414 as an etch mask, the second etching process 416 is performed and a number of second FSW spacers 418 are formed in the second device region 200P. The second etching process 416 may be in a way similar to the etching process 224 described with reference to FIGS. 9A and 9B. In some embodiments, the sacrificial structures 220 in the second device region 200P may be removed by the second etching process 416 or by another etching process. The second patterned mask film 414 may be removed after forming the second FSW spacers 418 in the second device region 200P.

Figure 31B:
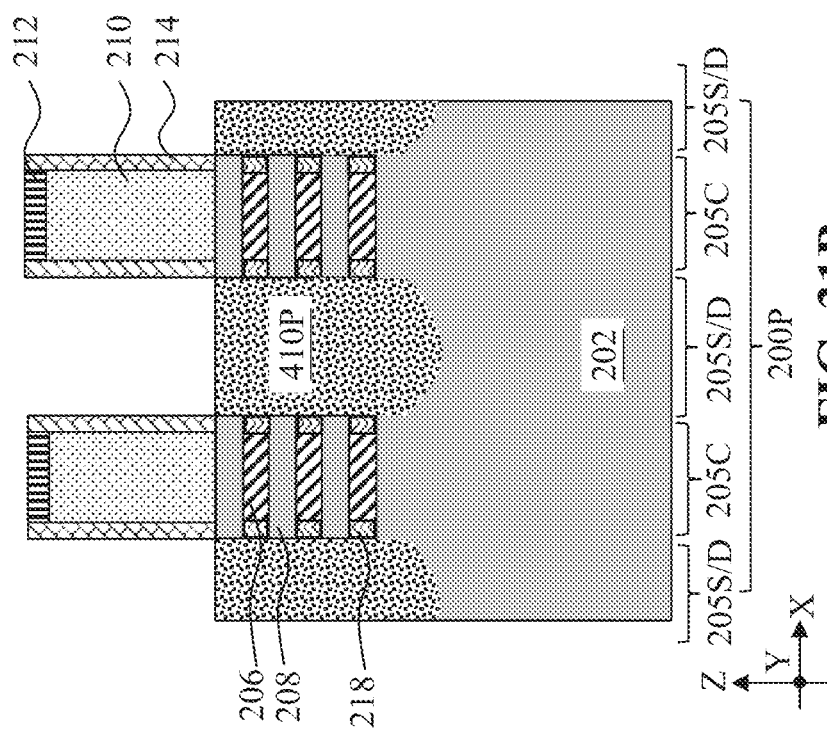
Figure 31A:
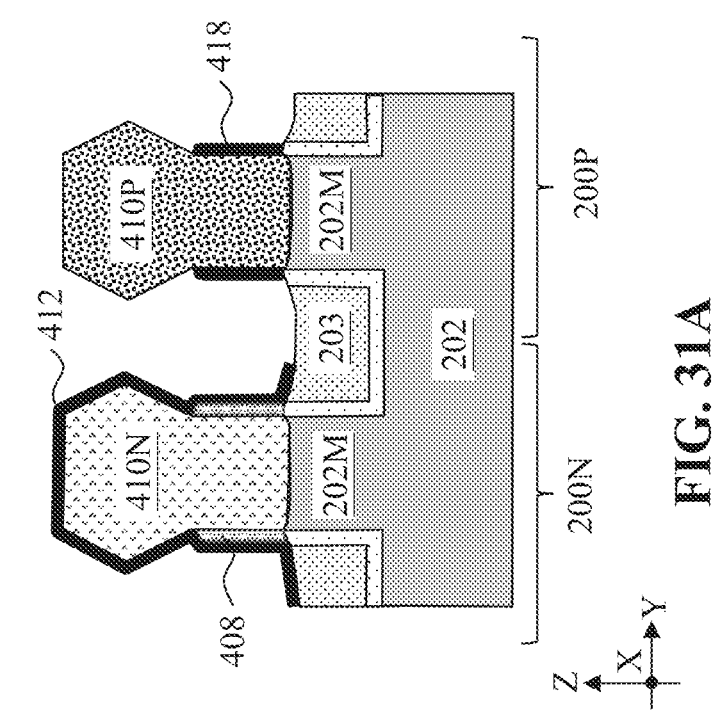

Referring now to FIGS. 22, 31A and 31B, method 300 includes a block 316 where p-type source/drain features 410P are formed in source/drain openings 216P in the second device region 200P. The formation and shape of the p-type source/drain features 410P may be in a way similar to those of the p-type source/drain features 230P described with reference to FIG. 12A. The second patterned mask film 414 may be removed after forming the source/drain features 410P. The portion of the second dielectric film 412 in the first device region 200A may be optionally removed. As shown in FIGS. 32A and 32B, the portion of the second dielectric film 412 in the first device region 200A is removed. In embodiments where a composition of the second dielectric film 412 is the same as the composition of the CESL 236, this portion of the second dielectric film 412 in the first device region 200A may not be removed. Operations in blocks 124 and 126 of method 100 may be then performed to finish the fabrication of the workpiece 400.

Figure 33B:
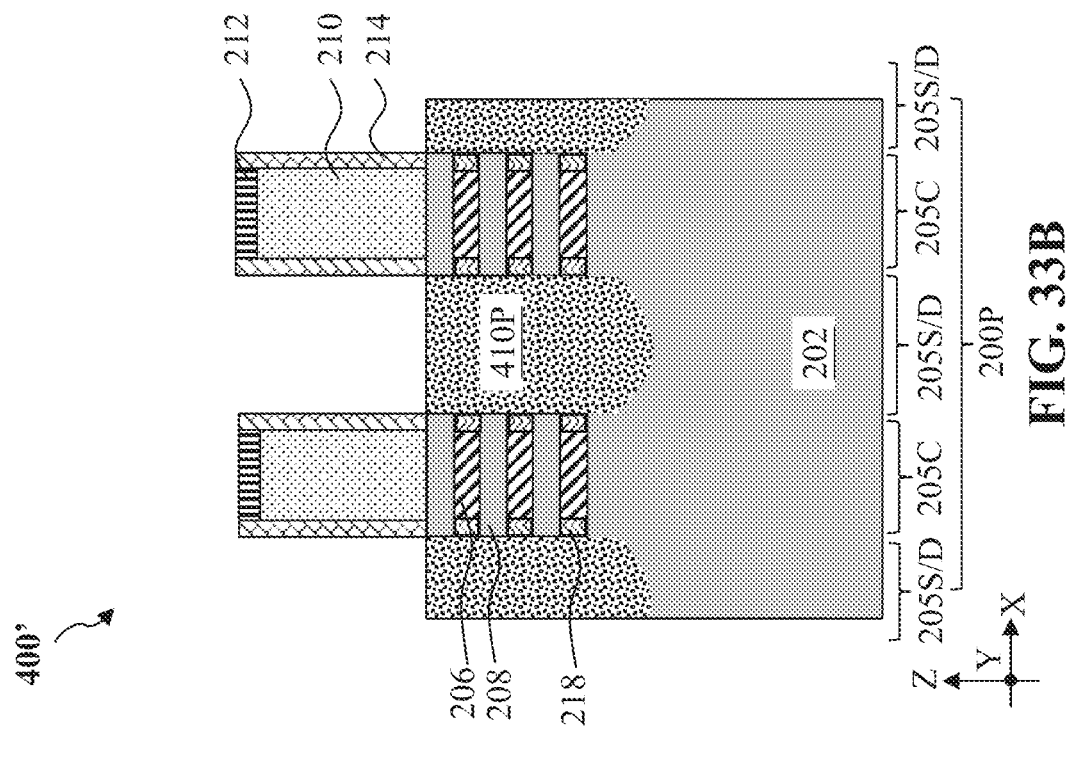
FIGS. 33A and 33B illustrate fragmentary cross-sectional views of a fourth alternative workpiece taken along line A-A and line B-B as shown in FIG. 2 during on intermediate fabrication stage in the method of FIG. 22, according to various aspects of the present disclosure.
Figure 33A:
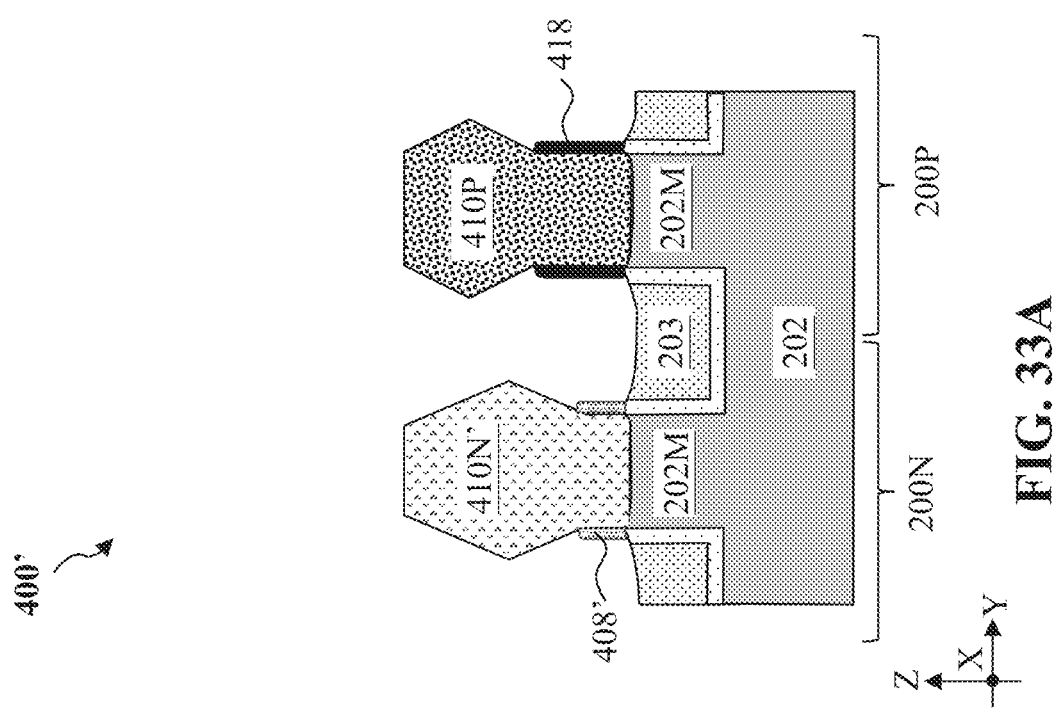

Different from the FSW spacers 226 which are formed simultaneously in the first device region 200N and the second device region 200P by method 100, the FSW spacers 408 in the first device region 200N and the FSW spacers 418 in the second device region 200P are formed in a sequential order in method 300. As such, the compositions of the dielectric films 402 and 412 and/or the parameters of the first etching process 406 and second etching process 416 may be configured to form FSW spacers having different heights in the first device region 200N and the second device region 200P, thereby forming different satisfactory source/drain features for different transistors. For example, FIGS. 33A-33B depict cross-sectional views of the workpiece 400' where the workpiece 400' includes first FSW spacers 408' in the first device region 200N and second FSW spacers 418 in the second device region 200P. The height of the first FSW spacers 408' is smaller than the height of the second FSW spacers 418, and the volume of the source/drain feature 410N' is greater than the volume of the source/drain feature 410P. Also, the volume of the source/drain feature 410N' is greater than the volume of the source/drain feature 410N. It is noted that, by adjusting the compositions of the dielectric films 402 and 412 and/or the parameters of the first etching process 406 and second etching process 416, the workpiece 400 may be fabricated to have FSW spacers with different height relationships and thus forming source/drain features with different volume relationships. One or more of the FSW spacers 408 and 418 may be fabricated to have an intentional tilted sidewall surface to further increase the volume of the corresponding source/drain feature, as described with reference to FIGS. 21A and 22A.

It is noted that, although method 100 forms the p-type source/drain feature 230P before forming the n-type source/drain feature 230N, method 100 may be used to form the n-type source/drain feature 230N before forming the p-type source/drain feature 230P. Method 300 may also be configured to form the p-type source/drain feature 410P before forming the n-type source/drain feature 410N. In some other implementations, the sacrificial structures 220 in the first device region 200N and the sacrificial structures 220 in the second device region 200P may be formed sequentially in any order and may be removed sequentially in any order. The corresponding FSW spacers in the first device region 200N and the corresponding FSW spacers in the second device region 200P may also be formed sequentially in any order.

Although not intended to be limiting, one or more embodiments of the present disclosure provide many benefits to a semiconductor structure and the formation thereof. For example, the present disclosure provides methods for forming a semiconductor structure including FSW spacers. In various embodiments, the FSW spacers may be configured to prevent or reduce the lateral growth of source/drain features, thereby preventing the merge of two adjacent source/drain features while providing satisfactory volumes. In various embodiments, the formation of the FSW spacers for n-type transistors and p-type transistors may be formed by separate deposition, photolithography, and etching processes, thereby heights of the respective FSW spacers may be adjusted to form different satisfactory source/drain features, increasing design flexibilities.

The present disclosure provides for many different embodiments. Semiconductor structures and methods of fabrication thereof are disclosed herein. In one exemplary aspect, the present disclosure is directed to a method. The method includes receiving a workpiece that includes a substrate, an active region protruding from the substrate and comprising a channel region and a source/drain region, and a dummy gate structure disposed over the channel region. The method also includes forming a source/drain trench in the source/drain region of the active region, forming a sacrificial structure in the source/drain trench, after the forming of the sacrificial structure, conformally depositing a dielectric film over the workpiece, performing a first etching process to etch back the dielectric film to form fin sidewall (FSW) spacers extending along sidewalls of the sacrificial structure, removing the sacrificial structure to expose the source/drain trench, forming an epitaxial source/drain feature in the source/drain trench, a portion of the epitaxial source/drain feature being sandwiched by the FSW spacers, and replacing the dummy gate structure with a gate stack.

In some embodiments, the removing of the sacrificial structure may be performed by the first etching process. In some embodiments, the first etching process may remove a portion of the dielectric film on a top surface of the sacrificial structure, and a second etching process may be performed to selectively remove the sacrificial structure without substantially etching the FSW spacers. In some embodiments, the active region may include a vertical stack of semiconductor layers disposed over the substrate, and the vertical stack comprises a plurality of channel layers interleaved by a plurality of sacrificial layers. In some embodiments, the method may include, before the forming of the sacrificial structure, selectively and partially etching the sacrificial layers to form inner spacer recesses, depositing a dielectric material layer over the workpiece, and etching back the dielectric material layer to form dielectric layers in the inner spacer recesses. The dielectric layers may at least partially fill the inner spacer recesses. In some embodiments, the dielectric film may include aluminum oxide, silicon oxynitride, silicon oxycarbonitride, or hafnium oxide. In some embodiments, the sacrificial structure may include undoped silicon, undoped germanium, undoped tin, or undoped carbon. In some embodiments, the forming of the sacrificial structure in the source/drain trench may include epitaxially growing an undoped semiconductor layer to partially fill the source/drain trench.

In another exemplary aspect, the present disclosure is directed to a method. The method includes receiving a workpiece comprising a first device region including a first fin-shaped active region protruding from a substrate and a second device region including a second fin-shaped active region protruding from the substrate, the first fin-shaped active region and the second fin-shaped active region each including a channel region disposed between two source/drain regions along a first direction. The method also includes forming a dummy gate structure over channel regions of the first fin-shaped active region and the second fin-shaped active region, forming source/drain openings in source/drain regions of the first and second fin-shaped active regions, forming sacrificial structures in the source/drain openings, depositing a dielectric film over the workpiece, performing an etching process to etch back portions of the dielectric film on top surfaces of the sacrificial structures to form FSW spacers in the first and second device regions, the etching process further removes the sacrificial structures, forming first epitaxial source/drain features in source/drain openings in the first device region, and forming second epitaxial source/drain features in source/drain openings in the second device region.

In some embodiments, the method may include after the performing of the etching process, forming a first patterned mask layer over the source/drain openings in the first device region while exposing source/drain openings in second device region, after the forming of the second epitaxial source/drain features, removing the first patterned mask layer, forming a second patterned mask layer over the second epitaxial source/drain features in the second device region, and after the forming of the first epitaxial source/drain features, removing the second patterned mask layer. In some embodiments, the sacrificial structures may include substantially vertical sidewalls. In some embodiments, a concentration of a p-type dopant in the first epitaxial source/drain features may be greater than a concentration of a p-type dopant in the sacrificial structures. In some embodiments, the sacrificial structures may include a tilted sidewall. In some embodiments, the workpiece may include an isolation structure disposed between the first fin-shaped active region and the second fin-shaped active region, and the FSW spacers may be disposed directly over the isolation structure. In some embodiments, the method may include replacing a portion of the dummy gate structure in the first device region with a first gate stack, replacing a portion of the dummy gate structure in the second device region with a second gate stack, and forming a dielectric structure to electrically and physically isolate the first gate stack with the second gate stack. In some embodiments, the first epitaxial source/drain features and the second epitaxial source/drain features may have different conductivity types.

In yet another exemplary aspect, the present disclosure is directed to a semiconductor structure. The semiconductor structure includes a substrate including a first mesa structure and a second mesa structure protruding from the substrate, a first vertical stack of nanostructures disposed over the first mesa structure, a first source/drain feature disposed over the first mesa structure and adjacent to the first vertical stack of nanostructures along a first direction, a second vertical stack of nanostructures disposed over the second mesa structure, a second source/drain feature disposed over the second mesa structure and adjacent to the second vertical stack of nanostructures along the first direction, the second source/drain feature being disposed adjacent to the first source/drain feature along a second direction perpendicular to the first direction, a first gate structure wrapping around each nanostructure of the first vertical stack of nanostructures, a second gate structure wrapping around each nanostructure of the second vertical stack of nanostructures, a first spacer extending along a sidewall surface of a lower portion of the first source/drain feature, and a second spacer extending along a sidewall surface of a lower portion of the second source/drain feature, the lower portion the first source/drain feature is spaced apart from the lower portion of the second source/drain feature by the first spacer, the second spacer, a contact etch stop layer, and a dielectric layer.

In some embodiments, a height of the first spacer may be different than a height of the second spacer. In some embodiments, a composition of the first spacer may be different than a composition of the second spacer. In some embodiments, the first spacer may include aluminum oxide, silicon oxynitride, silicon oxycarbonitride, or hafnium oxide.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   receiving a workpiece comprising:
      a substrate,
      an active region protruding from the substrate and comprising a channel region and a source/drain region, and
      a dummy gate structure disposed over the channel region;
   forming a source/drain trench in the source/drain region of the active region;
   forming a sacrificial structure in the source/drain trench;
   after the forming of the sacrificial structure, conformally depositing a dielectric film over the workpiece;
   performing a first etching process to etch back the dielectric film to form fin sidewall (FSW) spacers extending along sidewalls of the sacrificial structure;
   removing the sacrificial structure to expose the source/drain trench;
   forming an epitaxial source/drain feature in the source/drain trench, a portion of the epitaxial source/drain feature being sandwiched by the FSW spacers; and
   replacing the dummy gate structure with a gate stack.

2. The method of claim 1, wherein the removing of the sacrificial structure is performed by the first etching process.

3. The method of claim 1,
   wherein the first etching process removes a portion of the dielectric film on a top surface of the sacrificial structure, and
   wherein a second etching process is performed to selectively remove the sacrificial structure without substantially etching the FSW spacers.

4. The method of claim 1, wherein the active region comprises a vertical stack of semiconductor layers disposed over the substrate, and the vertical stack comprises a plurality of channel layers interleaved by a plurality of sacrificial layers.

5. The method of claim 4, further comprising:
   before the forming of the sacrificial structure, selectively and partially etching the sacrificial layers to form inner spacer recesses;
   depositing a dielectric material layer over the workpiece; and
   etching back the dielectric material layer to form dielectric layers in the inner spacer recesses,
   wherein the dielectric layers at least partially fill the inner spacer recesses.

6. The method of claim 1, wherein the dielectric film comprises aluminum oxide, silicon oxynitride, silicon oxycarbonitride, or hafnium oxide.

7. The method of claim 1, wherein the sacrificial structure comprises undoped silicon, undoped germanium, undoped tin, or undoped carbon.

8. The method of claim 1, wherein the forming of the sacrificial structure in the source/drain trench comprises epitaxially growing an undoped semiconductor layer to partially fill the source/drain trench.

9. A method, comprising:
   receiving a workpiece comprising a first device region including a first fin-shaped active region protruding from a substrate and a second device region including a second fin-shaped active region protruding from the substrate, the first fin-shaped active region and the second fin-shaped active region each including a channel region disposed between two source/drain regions along a first direction;

forming a dummy gate structure over channel regions of the first fin-shaped active region and the second fin-shaped active region;

forming source/drain openings in source/drain regions of the first and second fin-shaped active regions;

forming sacrificial structures in the source/drain openings;

depositing a dielectric film over the workpiece;

performing an etching process to etch back portions of the dielectric film on top surfaces of the sacrificial structures to form FSW spacers in the first and second device regions, the etching process further removes the sacrificial structures;

forming first epitaxial source/drain features in source/drain openings in the first device region; and forming second epitaxial source/drain features in source/drain openings in the second device region.

10. The method of claim 9, further comprising:

after the performing of the etching process, forming a first patterned mask layer over the source/drain openings in the first device region while exposing source/drain openings in second device region;

after the forming of the second epitaxial source/drain features, removing the first patterned mask layer;

forming a second patterned mask layer over the second epitaxial source/drain features in the second device region; and after the forming of the first epitaxial source/drain features, removing the second patterned mask layer.

11. The method of claim 9, wherein the sacrificial structures comprise substantially vertical sidewalls.

12. The method of claim 11, wherein a concentration of a p-type dopant in the first epitaxial source/drain features is greater than a concentration of a p-type dopant in the sacrificial structures.

13. The method of claim 9, wherein the sacrificial structures comprise a tilted sidewall.

14. The method of claim 9, wherein the workpiece further comprises an isolation structure disposed between the first fin-shaped active region and the second fin-shaped active region, and wherein the FSW spacers are disposed directly over the isolation structure.

15. The method of claim 9, further comprising:

replacing a portion of the dummy gate structure in the first device region with a first gate stack;

replacing a portion of the dummy gate structure in the second device region with a second gate stack; and forming a dielectric structure to electrically and physically isolate the first gate stack with the second gate stack.

16. The method of claim 9, wherein the first epitaxial source/drain features and the second epitaxial source/drain features have different conductivity types.

17. A method, comprising:

forming a gate structure over a channel region of a fin-shaped active region;

recessing a source/drain region of the fin-shaped active region to form a source/drain opening, the source/drain region is adjacent to the channel region;

forming a sacrificial feature in the source/drain opening;

after the forming of the sacrificial feature, forming a dielectric feature extending along a lower portion of the sacrificial feature;

after the forming of the dielectric feature, selectively removing the sacrificial feature; and forming a source/drain feature in the source/drain opening.

18. The method of claim 17, wherein the source/drain feature comprises a lower portion confined by the dielectric feature and an upper portion over the dielectric feature.

19. The method of claim 17, further comprising:

forming a gate spacer extending along a sidewall surface of the gate structure, wherein the dielectric feature and the gate spacer have different compositions.

20. The method of claim 17, wherein a height of the dielectric feature is less than a height of the source/drain feature.

* * * * *